(12) United States Patent \
Alexander

(10) Patent No.: US 6,262,728 B1 \
(45) Date of Patent: Jul. 17, 2001

(54) SYSTEM AND METHOD FOR ANNOTATING A GRAPHICAL USER INTERFACE DISPLAY IN A COMPUTER-BASED SYSTEM

(75) Inventor: Jay A Alexander, Monument, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/185,369

(22) Filed: Nov. 3, 1998

(51) Int. Cl.$^7$ ........................................ G06F 3/14 \
(52) U.S. Cl. ..................... 345/334; 345/134; 707/512 \
(58) Field of Search ..................... 345/326, 333, 345/334, 335, 339, 340, 342, 343, 348, 350, 133, 134, 150, 431; 707/500, 512, 530

(56) References Cited

U.S. PATENT DOCUMENTS

| | | | |
|---|---|---|---|
| 4,694,286 | * 9/1987 | Bergstedt ........................ | 345/153 |
| 5,367,623 | * 11/1994 | Iwai et al. ...................... | 345/350 |
| 5,521,615 | * 5/1996 | Boyan ............................ | 345/150 |
| 5,524,193 | * 6/1996 | Covington et al. .............. | 707/512 |
| 5,559,942 | * 9/1996 | Gough et al. ................... | 345/349 |
| 5,590,256 | * 12/1996 | Tchao et al. .................... | 707/525 |
| 5,596,700 | * 1/1997 | Darnell et al. .................. | 345/340 |
| 5,689,717 | * 11/1997 | Pritt ................................. | 707/512 |
| 5,806,079 | * 9/1998 | Rivette et al. .................. | 707/512 |
| 5,821,931 | * 10/1998 | Berquist et al. ................ | 345/346 |
| 5,920,297 | * 7/1999 | Alexander ....................... | 345/83 |
| 5,953,009 | * 9/1999 | Alexander ....................... | 345/348 |
| 6,054,984 | * 4/2000 | Alexander ....................... | 345/339 |

* cited by examiner

Primary Examiner—Crescelle N. dela Torre

(57) ABSTRACT

An annotation system and methodology for annotating a display of a computer-based system that includes a graphical user interface. Generally, the annotation system enables an operator to generate a graphical annotation label containing any desired data, and to graphically position the annotation label at any desired location on the display, enabling the operator to positionally associate the graphical annotation label with a desired graphical element displayed on the graphical user interface. The annotation system is constructed and arranged to enable an operator to graphically generate an annotation label containing operator-generated information and to graphically alter the position of the annotation label such that the annotation label is positionally associated with a desired graphical element on the graphical user interface. The annotation label may be implemented as dialog box, window or other display region in the graphical environment provided by the graphical user interface.

21 Claims, 16 Drawing Sheets

| LABEL CODE PNTR | LABEL No. | LOCATION | | LABEL CONTENT | RENDERING INFORMATION | | | | |
|---|---|---|---|---|---|---|---|---|---|
| | | X | Y | | TEXT COLOR | BACKGROUND COLOR | OUTLINE | FONT | REFERENCE SYMBOL |
| 0X AC3F0000 | n | 0 | 0 | LABEL n (RIGHT CLICK FOR OPTIONS) | BLACK | WHITE | OFF | LARGE | NONE |
| 0X AC3FF000 | n+1 | 440 | 260 | XYZ.GIF | BLACK | OPAQUE | YES | SMALL | NW |

*FIG. 4*

SYSTEM AND METHOD FOR ANNOTATING A GRAPHICAL USER INTERFACE DISPLAY IN A COMPUTER-BASED SYSTEM

RELATED APPLICATION

This application is related to commonly owned U.S. utility patent application Ser. No. 09/185,410, entitled "System and Method for Graphically Annotating a Waveform Display in a Signal-Measurement System," filed concurrently herewith and naming as inventor Jay A. Alexander.

BACKGROUND OF THE INVENTION

1. Field of the Invention

The present invention relates generally to a graphical user interface and, more particularly, to graphically annotating a display of a computer-based system.

2. Related Art

A common technique for presenting information to users of computer-based systems is through use of a graphical user interface (GUI). A graphical user interface is typically part of an environment provided by an operating system executed by a processor in the computer system. Generally, the GUI is controlled by the operating system in response to commands provided by a user and application programs or other processes executing on or accessible to the computer-based system.

Common to virtually all conventional GUIs is the use of a mouse or other pointing device in a windowed environment. Windows are rectangular areas presented on a display that contain textual and/or graphical information related to the operation of the application program, operating system or other processes. Generally, additional display elements are provided by the GUI to facilitate interactions with the windows. These include, for example, menus, title bars, buttons, select boxes and icons. For a more detailed explanation of the operation of GUIs in general and Windows® in particular, see "Microsoft Windows version 3.1 User's Guide," and "Microsoft Windows 95 User's Guide," available from Microsoft, Inc.

In this environment, the user interacts with the computer by using a keyboard and/or by manipulating the cursor displayed on the GUI with a pointing device. To enter information into the computer system, a user typically interacts with a displayed window. In addition, under certain circumstances a "dialog box" is displayed on the GUI to enable the user to enter specific information into the computer system. Dialog boxes are special windows presented on the GUI to facilitate providing inputs to the computer to control application programs or other processes occurring within or accessible to the computer system. Dialog boxes generally present logically related control input display elements, such as fields for numeric or text entry, icons, select boxes, buttons and a myriad of other known display elements that enable a user to set parameters or otherwise effect control of the desired process or system.

There is a need to document real-time events occurring on systems accessible by or within a computer-based system. Such documentation is generally created through manually creating notes with pen and paper or word processing application program.

SUMMARY OF THE INVENTION

The present invention is a real-time annotation system and methodology for annotating a display of a computer-based system that includes a graphical user interface. Generally, the annotation system enables an operator to generate a graphical annotation label containing any desired data, and to graphically position the annotation label at any desired location on the display, enabling the operator to positionally associate the graphical annotation label with a desired graphical element displayed on the graphical user interface.

A number of aspects of the invention are summarized below, along with different embodiments that may be implemented for each of the summarized aspects. It should be understood that the embodiments are not necessarily inclusive or exclusive of each other and may be combined in any manner that is non-conflicting and otherwise possible. It should also be understood that these aspects of the invention are exemplary only and are considered to be non-limiting.

In one aspect of the invention, the annotation system is constructed and arranged to enable an operator to graphically generate an annotation label containing operator-generated information and to graphically alter the position of the annotation label such that the annotation label is positionally associated with a desired graphical element on the graphical user interface. The annotation label may be implemented as dialog box, window or other display region in the graphical environment provided by the graphical user interface.

The information may be predefined or created during real-time operations. The information may be textual or graphical in form. The operator may enter the information into the system using a physical keyboard or a graphically-displayed keyboard on which the operator graphically selects displayed keys of the graphical keyboard through use of a cursor controlled by a pointing device. In alternative embodiments, the information may be entered by the operator through a voice recognition system. The operator can control the appearance characteristics of the rendered annotation label, the appearance characteristics represented by rendering options. Preferably, the annotation label may include an information content as well as additional display elements to facilitate visual association with the desired feature.

Specifically, the annotation system includes a plurality of label control units each constructed and arranged to control operator interactivity with an associated annotation label rendered on the graphical user interface, and an annotation label manager constructed and arranged to provide centralized control over invocation and removal of each of the label control units and, hence, of their associated annotation labels.

Preferably, the annotation system enables an operator to determine an appearance of annotation labels. In such an embodiment, each label control unit provides the operator with the capability to determine the content of the associated annotation label, the location of the annotation label on the display and the appearance of the annotation label.

In certain embodiments, the annotation label manager maintains, in a label state data structure, a current state of each of the plurality of associated annotation labels currently rendered on the graphical user interface. Preferably, the label state data structure is globally accessible to other elements of the computer-based system. In this embodiment, the function calls provided to the label control units from graphical user interface which are relevant to the appearance and content of the associated annotation labels are forwarded to the annotation label manager.

The current state includes a label number uniquely identifying each displayed annotation label; a label pointer providing an address of the label control unit that generated the annotation label; location information identifying a current location of the annotation label on the display; and label content information identifying contents of the annotation label. In one embodiment, the current state further includes rendering information identifying an appearance of the annotation label when the annotation label is rendered on the graphical user interface. In another embodiment, the current state further includes a reference symbol identifier that identifies a location of a file that contains a graphical symbol that visually associates the annotation label with an element displayed on the graphical user interface. The reference symbol may be a graphical directional symbolic icon, and may be selectable from a palate of such icons.

The rendering information may include text color identifying a color of text rendered in the annotation label, background color identifying a color of background area of the annotation label, font specification identifying a font size of text rendered in the annotation label or outline specification identifying whether a predefined border is to be rendered around the annotation label.

The graphical user interface provides display elements in association with a displayed annotation label, and generates function calls to the label control unit associated with the displayed annotation label in response to an operator graphically selecting the display element. The graphical user interface generates function calls to the label management unit in response to an operator graphically selecting display elements other than the display elements generated in connection with an annotation label. The function calls provided to the plurality of label control units related to creation and deletion of associated annotation labels are forwarded to the annotation label manager. The annotation label manager generates, in response to such function calls, system calls that cause the operating system to create and destroy label control units.

Preferably, the annotation label manager stores in a memory device default values for the location and the content of the displayed associated annotation labels. In embodiments wherein operator control of annotation label appearance is also supported, the annotation label manager further stores in the memory device default values for the appearance of the displayed associated annotation labels. Preferably, such default values for appearance are dynamically maintained in real-time, updated to reflect recent selections of the operator.

The default location values may result in the annotation labels being located at the origin of the display or, in alternative embodiments, at a current position of the cursor. In certain embodiments, which default location is selected is based on the context in which the operator graphically requested the creation of a new annotation label.

The label control unit reconciles positional conflicts between new annotation labels and currently rendered annotation labels. In addition, in certain embodiments the annotation system restricts the location of the plurality of annotation labels to locations entirely within the display region. This restriction based on rectangle limits data identifying dimensions of the display region, the location and size of each of the plurality of annotation labels.

In one embodiment, the label control unit includes a display controller constructed and arranged to interoperate with the graphical user interface to display and control the associated annotation label on graphical user interface, wherein the display controller is constructed and arranged to control the position and operator interactivity with the associated annotation label on graphical user interface. The label control unit also includes a position controller constructed and arranged to control the location and size of the associated annotation label wherein the position controller determines whether the location of the annotation label is within the boundaries of a display region wherein the position controller also determines whether annotation label is too large for the display region and, if so, adjusts the size of the label accordingly. In certain embodiments, the label control unit also includes a command processor constructed and arranged to route function calls from graphical user interface to annotation label manager and forwards certain commands to display controller and others to positional controller.

In one embodiment of this aspect of the invention, the annotation label manager includes an annotation label generation control unit constructed and arranged to instantiate and destroy label control units based on the create and delete function calls. It also includes an annotation label maintenance unit constructed and arranged to maintain the label state data structure, the maintenance unit receiving rendering information from graphical user interface and updates the label state data structure with such information to maintain the annotation label current state. Preferably, the annotation label generation control unit is further constructed and arranged to store annotation label default values in default values data structure and to determine initial values for rendering an annotation label.

In another aspect of the invention a computer-based system is disclosed. The system includes an operating system and a graphical user interface. An annotation system for graphically annotating measurement waveforms displayed on a graphical user interface is also included. The annotation system is constructed and arranged to enable an operator to graphically generate an annotation label containing operator-generated information and to position the annotation label to any location on the display.

Preferably, the operator can also control appearance characteristics of the plurality of annotation labels displayed on the graphical user interface. The location of the plurality of annotation labels includes those that positionally associate the displayed annotation labels with a desired feature also displayed on the graphical user interface. In one preferred embodiment, the annotation labels include additional graphical elements to facilitate visual association with the desired feature.

Specifically, the annotation system includes a plurality of label control units each constructed and arranged to control operator interactivity with an associated annotation label rendered on the graphical user interface. The plurality of label control units provide the operator with the capability to determine content and display location of the associated annotation label. An annotation label manager is also included. The manager is constructed and arranged to provide centralized control over invocation and removal of each of the plurality of label control units and, hence, of the display of the associated annotation labels.

In one embodiment, the annotation label manager maintains, in a label state data structure, a current state of each of the plurality of associated annotation labels currently rendered on the graphical user interface, the current state including the position, appearance and the content of the displayed annotation labels. The current state includes a label number uniquely identifying each displayed annotation label; a label pointer providing an address of the label control unit that generated the annotation label; location information identifying a current location of the annotation label on the display; and label content information identifying contents of the annotation label. Preferably, the current state further includes rendering information identifying an appearance of the annotation label when the annotation label is rendered on the graphical user interface.

Preferably, annotation label manager is constructed and arranged to generate, in response to the creation and deletion function calls generated by the graphical user interface, system calls that cause an operating system to create and destroy specified ones of the label control units. Preferably, the annotation label manager stores in a memory device default values for the location, the appearance and content of the displayed annotation labels.

In one embodiment, the label control unit includes a display controller constructed and arranged to interoperate with the graphical user interface to display and control the associated annotation label on graphical user interface. The display controller is constructed and arranged to control the position and operator interactivity with the associated annotation label on graphical user interface. The label control unit also includes a position controller constructed and arranged to control the location and size of the associated annotation label wherein the position controller determines whether the location of the annotation label is within the boundaries of a display region wherein the position controller also determines whether annotation label is too large for the display region and, if so, adjusts the size of the label accordingly. In certain embodiments, the label control unit also includes a command processor constructed and arranged to route function calls from graphical user interface to annotation label manager and forwards certain commands to display controller and others to positional controller.

In one embodiment of this aspect of the invention, the annotation label manager includes an annotation label generation control unit constructed and arranged to instantiate and destroy label control units based on the create and delete function calls. It also includes an annotation label maintenance unit constructed and arranged to maintain the label state data structure, the maintenance unit receiving rendering information from graphical user interface and updates the label state data structure with such information to maintain the annotation label current state. Preferably, the annotation label generation control unit is further constructed and arranged to store annotation label default values in default values data structure and to determine initial values for rendering an annotation label.

In another aspect of the invention, a method for graphically displaying modifying an annotation label on a graphical user interface is disclosed. The method comprises: (1) displaying on graphical user interface a display element representing the addition of an annotation label on the graphical user interface; (2) graphically selecting the annotation display element; (3) displaying, on the graphical user interface, a dialog box providing the operator with the ability to enter a desired content to be displayed in the annotation label; (4) graphically entering data into the dialog box; and (5) displaying the annotation label on the graphical user interface.

Various embodiments of the present invention provide certain advantages and overcome certain drawbacks of the above and other conventional techniques. Not all embodiments of the present invention share the same advantages and those that do may not share them under the same or similar circumstances. This being the case, said present invention provides numerous advantages, including those identified herein below.

An advantage of the annotation system of the present invention enables an operator to annotate and otherwise document displays as an integral part of the task being performed. The positional association of the annotation labels on the graphical user interface results in an integrated display and, when digitally stored or printed, an integrated and complete record. As a result, the annotation information can be initially stored by one operator and subsequently retrieved by the same or a different operator from the same or a remote location.

A further advantage of the present invention is that it enables the operator to provide any desired information to document the display. There is no restriction as to quality, type, size or other characteristic of the information provided.

Another advantage of the present invention is that only a limited knowledge of the computer-based system is required to annotate the display. A still further advantage of the present invention is that the information may be provided in any useful form, such as textual, iconic, symbolic or other forms. This provides a mechanism that presents a great deal of information in a limited display area.

A still further advantage of the present invention is that the annotation labels may be easily repositioned to any desired location of the display. Repositioning the annotation label requires little or no time or understanding of the system. Furthermore, the present invention provides the operator with the ability to select rendering options to achieve a desired appearance for each annotation label displayed on the system.

Further features and advantages of the present invention as well as the structure and operation of various embodiments of the present invention are described in detail below with reference to the accompanying drawings. In the drawings, like reference numerals indicate identical or functionally similar elements. Additionally, the left-most one or two digits of a reference numeral identifies the drawing in which the reference numeral first appears.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

FIG. 4 is an illustration of one embodiment of a label state data structure created and maintained by the annotation system illustrated in FIG. 2;

DETAILED DESCRIPTION

The present invention is a real-time annotation system and methodology for annotating displays in a computer-based system that includes a graphical user interface for displaying waveforms and measurement results on a computer-based system display. In one aspect of the invention, the annotation system is configured to enable an operator to graphically generate an annotation label containing any desired information and to position the annotation label at any desired location on the display, including positionally associating the annotation label with desired waveform(s) or waveform feature(s) displayed on the computer-based system graphical user interface. The information may be predefined or represent real-time observations, and may be of any form, including textual and symbolic information. Preferably, the operator can also control the appearance characteristics of the rendered annotation label. It is also preferable that additional icons be available for inclusion in the annotation label to facilitate visual association with a desired waveform or waveform feature.

Figure 1:
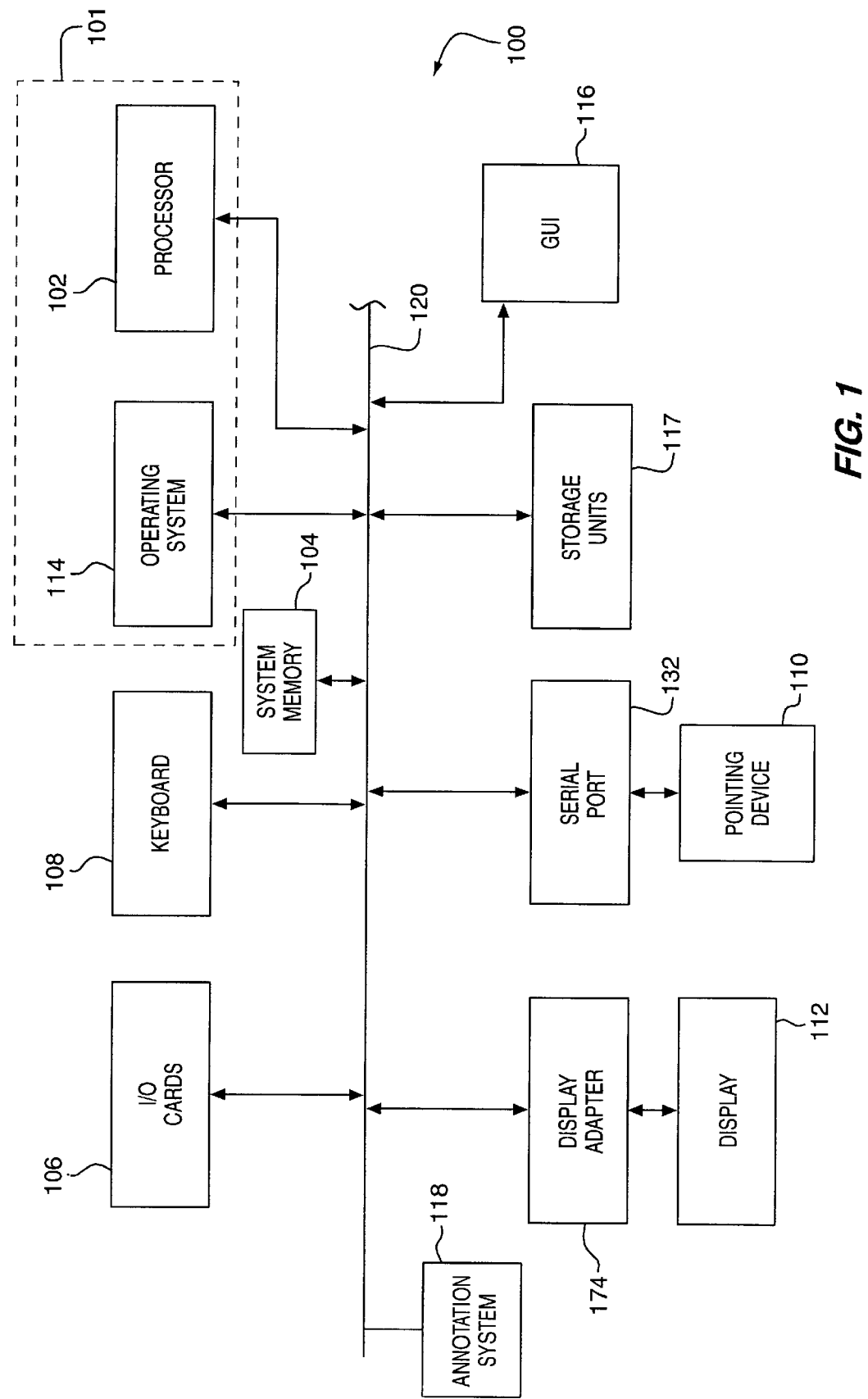
FIG. 1 is a functional block diagram of a computer-based system suitable for implementing the annotation system and method of the present invention.

FIG. 1 is a functional block diagram of an exemplary computer-based system also suitable for implementing the present invention. Computer system 100 is but one example of many possible computer system configurations capable of being used with the present invention is illustrated. The computer system 100 is preferably a general purpose computer system which is programmable using a high-level computer programming language.

Computer system 100 includes a number of basic subsystems represented by blocks for ease of illustration. The computer system 100 includes a processor 102, a memory unit 104, input/output interface cards 106, storage units 117 such as a hard disk drive and a floppy disk drive, one or more input devices such as keyboard 108 and pointing devices 110 and display 112. The memory 104 is used for storage of program instructions and for storage of results of calculations performed by the processor 102. In a preferred embodiment, the memory 104 includes random access memory (RAM). The display 112 is preferably a liquid crystal display and is logically or physically divided into an array of picture elements referred to as pixels. The inputs/output interface cards 106 may be modem cards, network interface cards, sound cards, etc. Additional subsystems such as a display adaptor 174 and others are shown.

The processor 102 is typically a commercially available processor such as the Pentium microprocessor, PowerPC microprocessor, SPARC processor, PA-RISC processor or a 68000 series microprocessor. Many other processors are also available. Such a processor usually executes a program referred to as an operating system 114 such as the various versions of the Windows operating systems from Microsoft Corporation, the NetWare operating system available from Novell, Inc., or the Unix operating system available from many vendors such as Sun Microsystems, Inc. and Hewlett-Packard Company. The operating system 114 controls the execution of other computer programs such as a graphical user interface (GUI) 116 and the dialog box control system 118, and provides scheduling, input/output control, file and data management, memory management and related services. The processor 102 and operating system 114 define a computer platform shown by dashed block 101, for which application programs and high-level programming languages are written. The functional elements of the computer system 100 communicate with each other via one or more buses 120. The interconnection via system bus 120 allows central processor 102 to communicate with each subsystem and to control the execution of instructions from system memory 104 or fixed disk 176, and the exchange of information between subsystems. Other arrangements of subsystems and interconnections are possible. The storage unit 117 may include disk drives, magnetic tape, solid state memory, bubble memory, etc.

In one embodiment, annotation system 118 is implemented in software routines which interoperate with the components of the implementing computer-based system to perform annotation functions in accordance with the present invention. Such software routines typically reside in memory 104 and/or disk storage devices 117, and may be stored on any other computer-readable medium such as, for example, magnetic disk, compact disc or magnetic tape, and may be loaded into the computer system 100 using an appropriate peripheral device as known in the art. Preferably, this embodiment of the annotation system 118 is implemented in a well-known object-oriented programming language such as C++. Those skilled in the art will appreciate that different implementations, including different function names, programming languages, data structures, and/or algorithms may also be used in embodiments of the present invention other than those described below. It should be further understood that the invention is not limited to a particular computer platform, particular operating system, particular processor, or particular high level programming language, and that the hardware components identified above are given by way of example only. Annotation system 118 may be implemented, for example, in dedicated hardware, firmware, or any combination thereof.

Annotation system 118 is a simple and intuitive apparatus and associated methodology that enables an operator to generate and manage multiple graphical annotation labels and to positionally associate such annotation labels with desired displayed features, thereby providing a quick and efficient documentation capability. Annotation system 118 enables an operator to determine the size, position, content and appearance of the annotation labels.

As used herein, the term "annotation label" refers generally to a commonly available window that is displayed on a display with a graphical user interface and/or an operating system, such as display windows, dialog boxes or other commonly available or customized graphical user interface display regions. In one embodiment of the present invention, annotation system 118 interoperates with a currently existing operating system 114, utilizing existing system calls provided by a standard application programming interface (API). In one particular embodiment, annotation system 118 generates dialog boxes to render the annotation labels of the present invention. Conventional operating systems provide system calls for creating and deleting such dialog boxes. For example, the Windows® operating system available from Microsoft, Inc., provides "CreateWindow" and "DestroyWindow" system calls. Execution of these system calls invokes conventional and well known modeless dialog box functionality. Such operations of conventional operating systems is considered to be well known in the art and is not described further herein. Again, it should be understood, however, that any type of display window or other display region may be utilized by the present invention to display annotation labels. For example, in one alternative embodiment, the present invention generates conventional windows as annotation labels.

Quite apart from how annotation labels are displayed, dialog boxes are displayed by annotation system 118 to enable the operator to create, edit, delete or otherwise manipulate annotation labels. Dialog boxes are generally special interactive windows which present logically related control input display elements that enable an operator to set parameters or otherwise effect system control. Dialog boxes are generally presented on graphical user interface 116 to enable an operator to enter information and make selections, facilitating control of an operating system, application program or other process occurring within or accessible to the implementing computer-based system. The control inputs may be in any form, such as selection of an icon, select box, button or other display element, entry of numeric, alphabetic or alphanumeric information into an entry field, scroll bars, and the like. Numerous other techniques now or later developed may be used with the present invention to display options and provide the operator with the ability to enter selections or other information on a computer user interface to graphically interact with annotation system 118 and graphical user interface 116.

Figure 2:
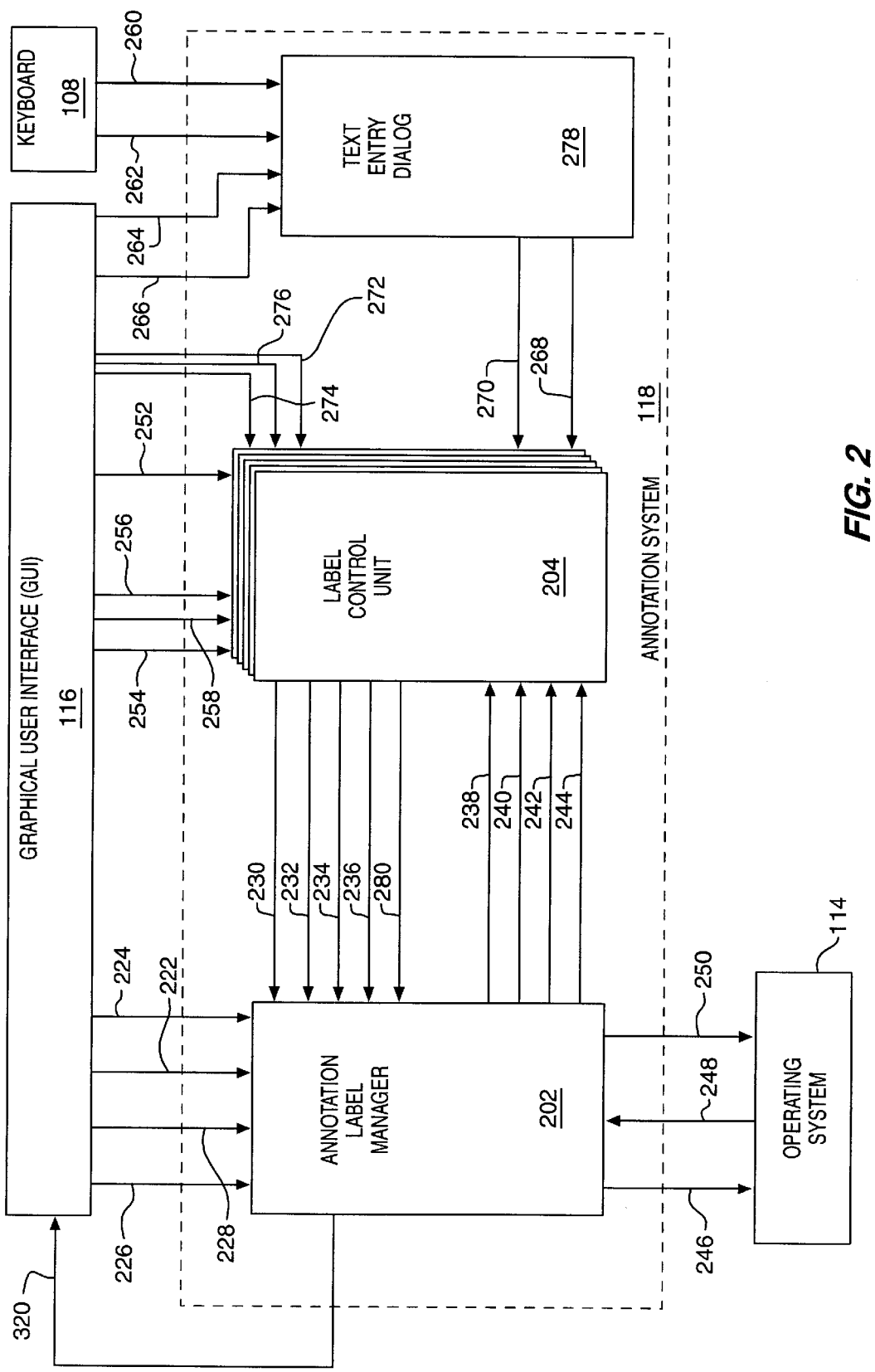
FIG. 2 is a functional block diagram of one embodiment of the annotation system of the present invention implemented in the system illustrated in FIG. 1.
Figure 3A:
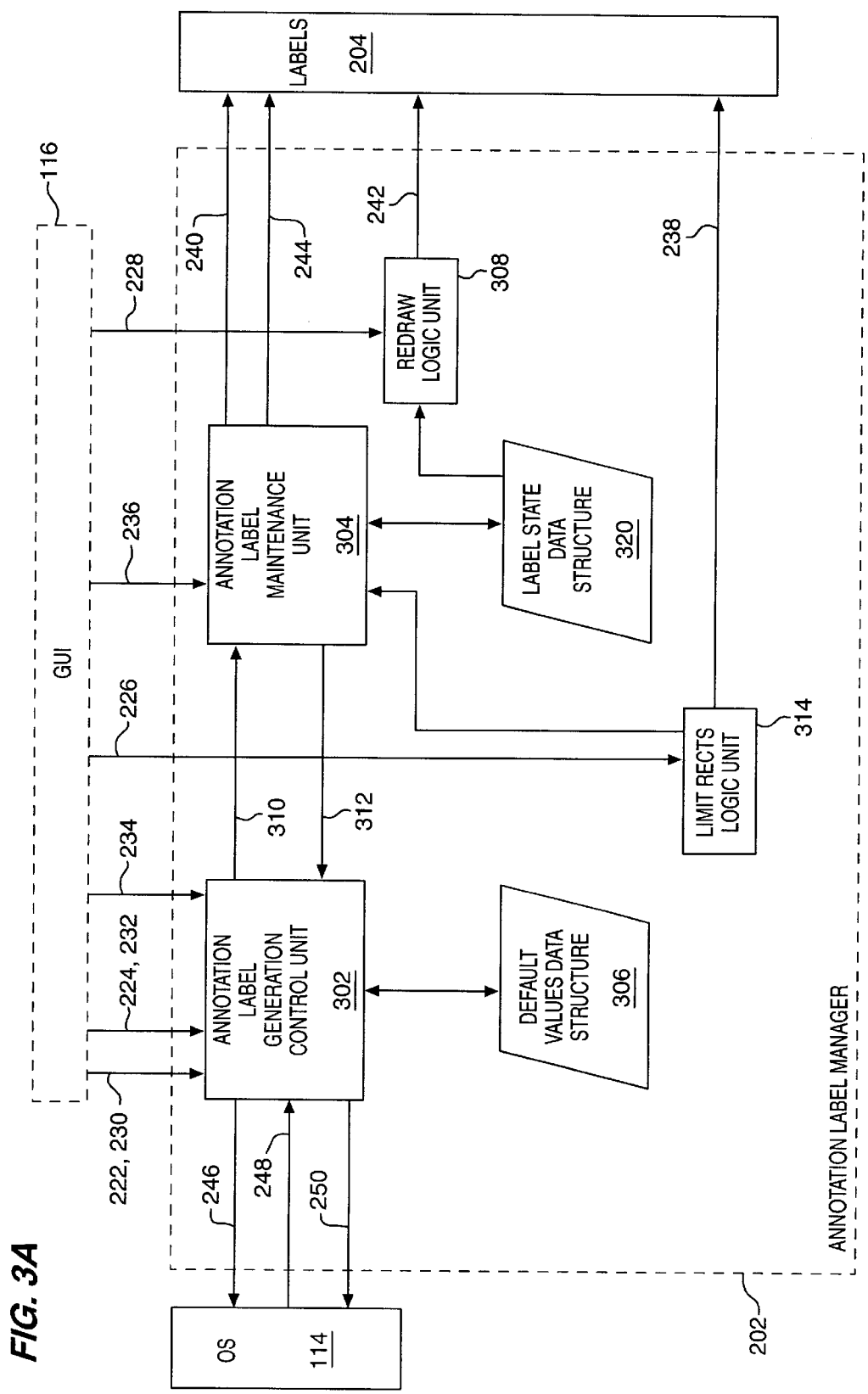
FIG. 3A is a functional block diagram of one embodiment of the annotation label manager implemented in the annotation system illustrated in FIG. 2.
Figure 3B:
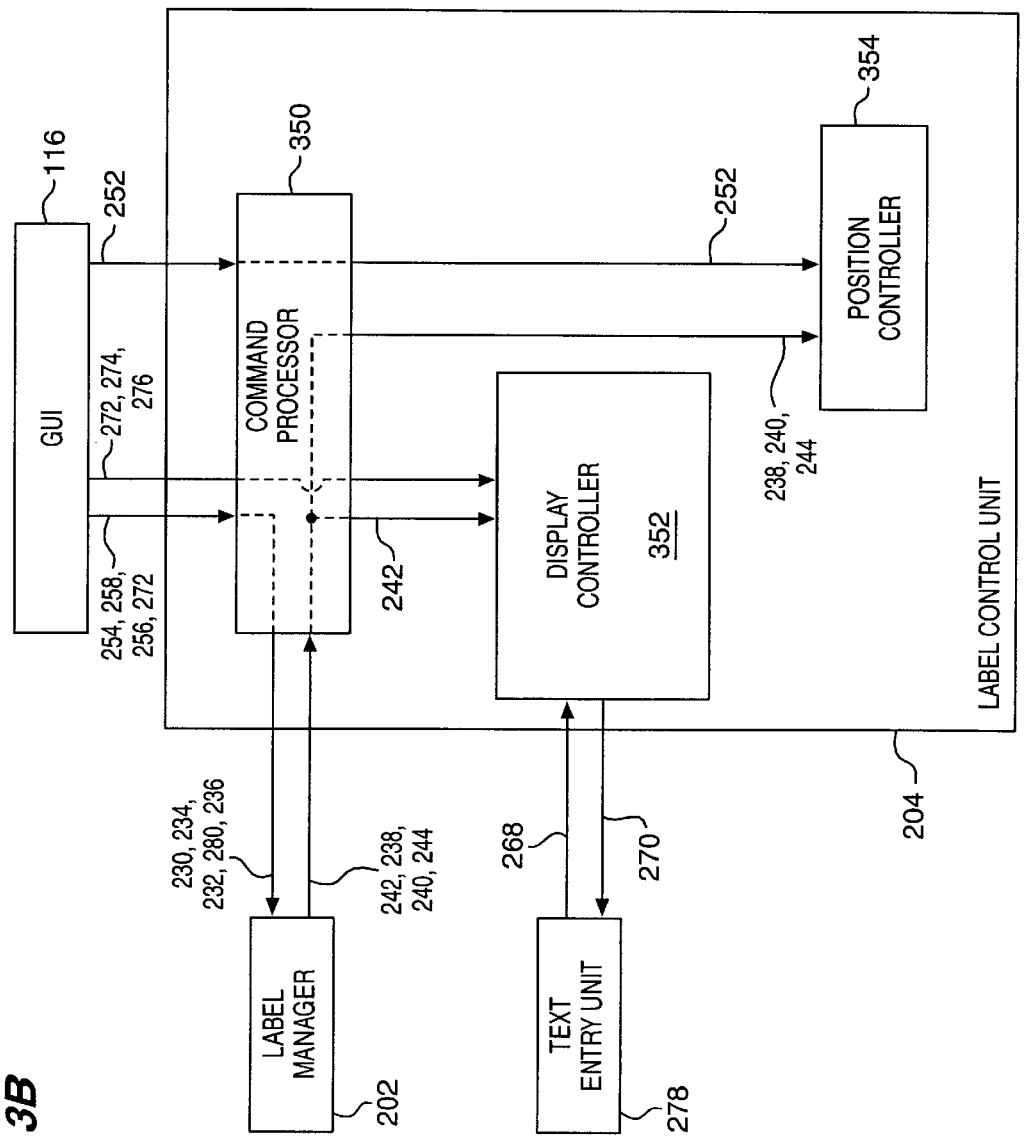
FIG. 3B is a functional block diagram of one embodiment of the label control unit implemented in the annotation system illustrated in FIG. 2.

A functional block diagram of one embodiment of the annotation system 118 of the present invention is shown in FIGS. 2, 3A and 3B. Certain data structures created and accessed by this embodiment of annotation system 118 are illustrated in detail in FIG. 4. The function and operation of annotation system 118 will be described with reference to FIGS. 2–4, and exemplary annotation labels and associated dialog boxes are provided in exemplary displays shown in FIGS. 5–9. These displays are rendered on display 112 using graphical user interface 116.

The exemplary embodiment illustrated in FIG. 2 is implemented to enable the present invention to operate with a conventional operating system 114 and a graphical user interface 116 modified in accordance with the present invention. In another aspect of the present invention, an operating system incorporating the functionality of the present invention is disclosed. In still another aspect, a graphical user interface incorporating the functionality of the present invention is provided. Such aspects do not require the management of commands and function calls as in the embodiments described herein since the functionality would be incorporated and distributed within the operating system 114 or graphical user interface 116 rather than communicating with them. It follows, then, that in other alternative embodiments, the functionality of the present invention may be distributed between a graphical user interface 116 and an operating system 114 in various manners. Achieving these various alternative implementations is considered to be apparent to those of ordinary skill in the relevant arts and, therefore, are not described further herein.

FIG. 2 is a functional block diagram of one embodiment of annotation system 118 of the present invention. A high level description of the exemplary embodiment of annotation system 118 will now be provided in detail below with reference to the exemplary graphical user interface displays illustrated in FIGS. 5–9. The following description will be provided in the context of a graphical user interface generating a measurement display generated by the computer-based system. It should be understood from the following description that the present invention may be implemented in any graphical user interface generating displaying any desired display elements.

Figure 5:
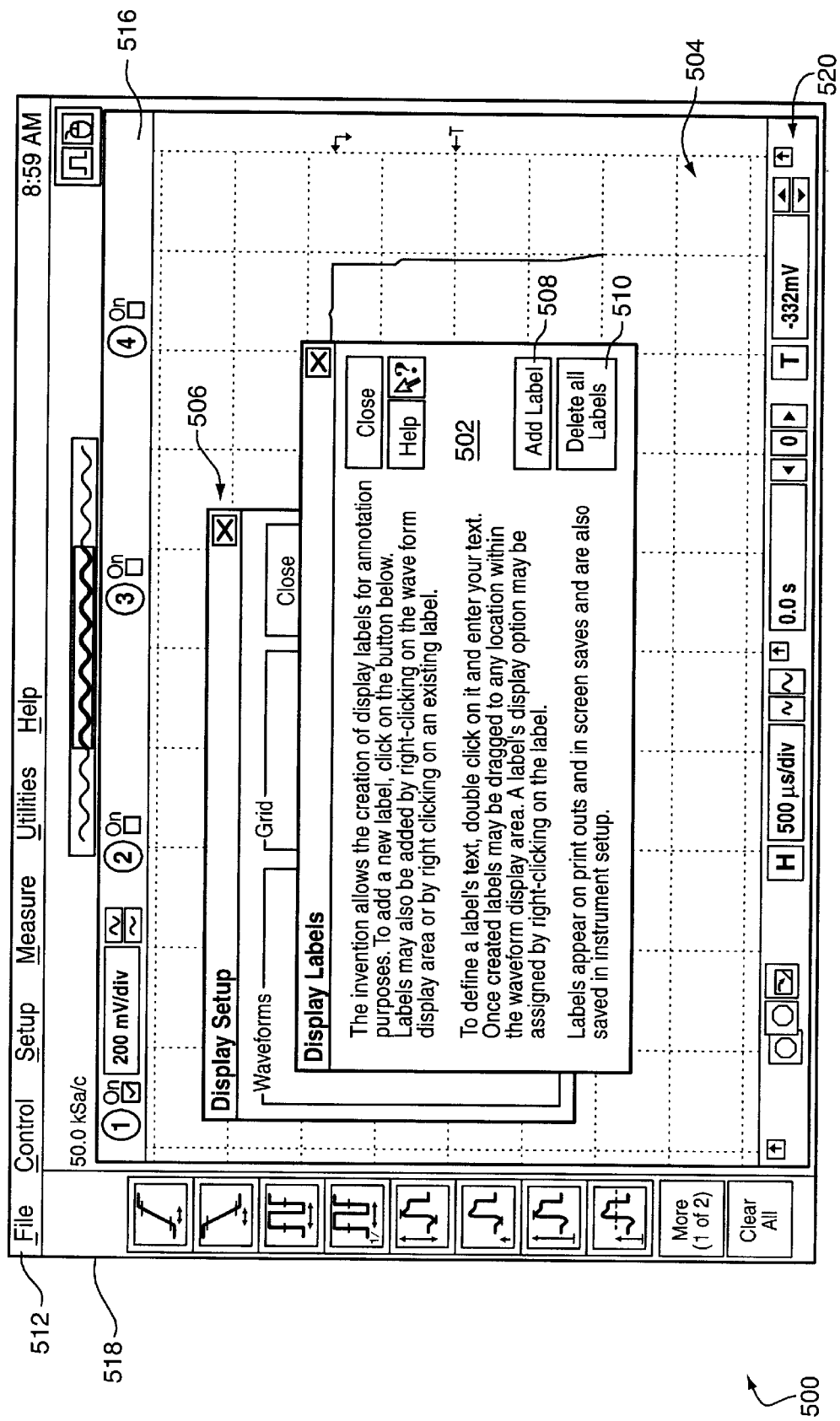
FIG. 5 is an illustration of a graphical user interface showing an initial "Display Labels" instruction dialog box displayed in accordance with one embodiment of the present invention.
Figure 6:
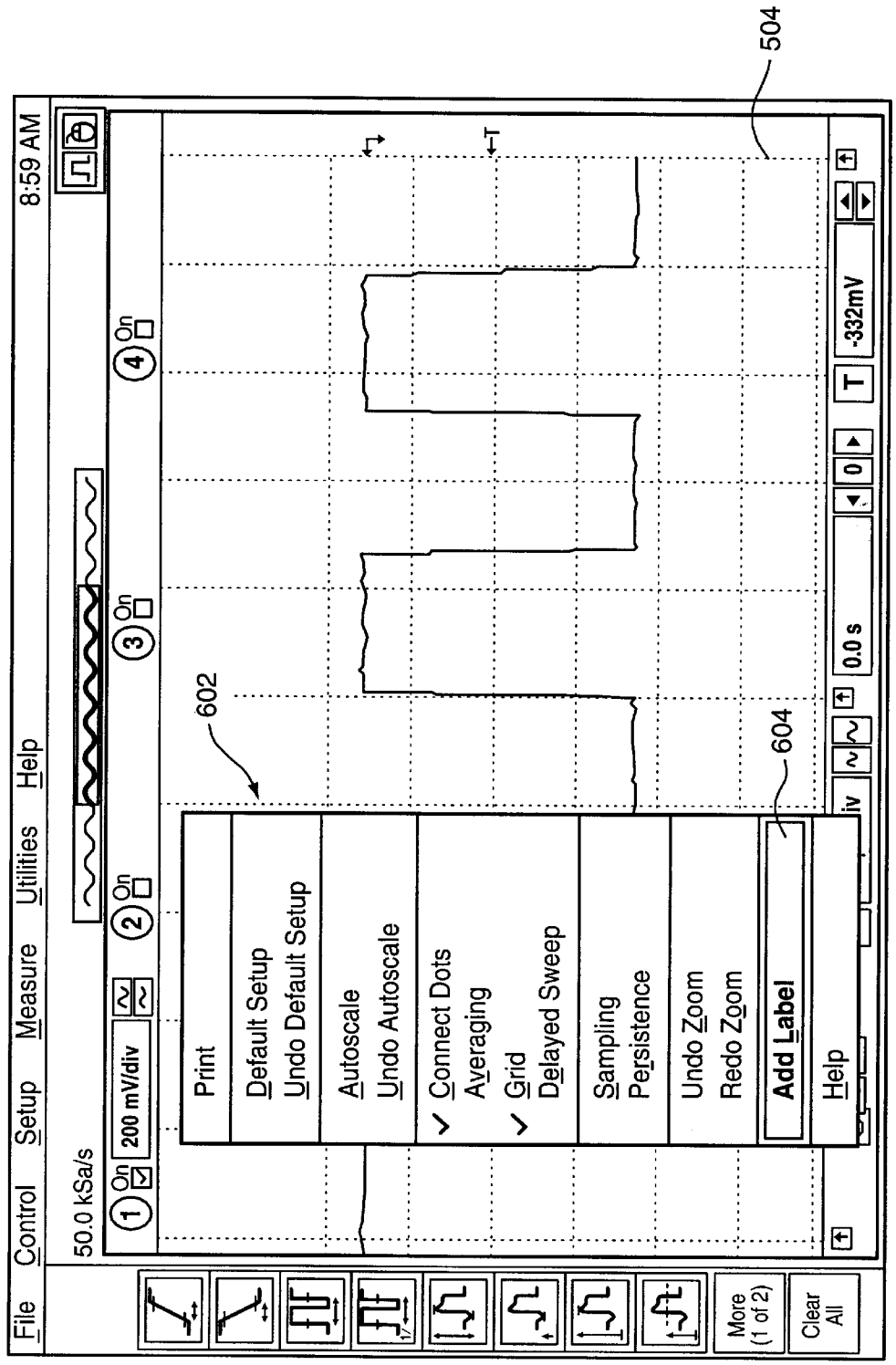
FIG. 6 is an illustration of a graphical user interface showing a general instruction menu list displayed accordance with one embodiment of the present invention.
Figure 7:
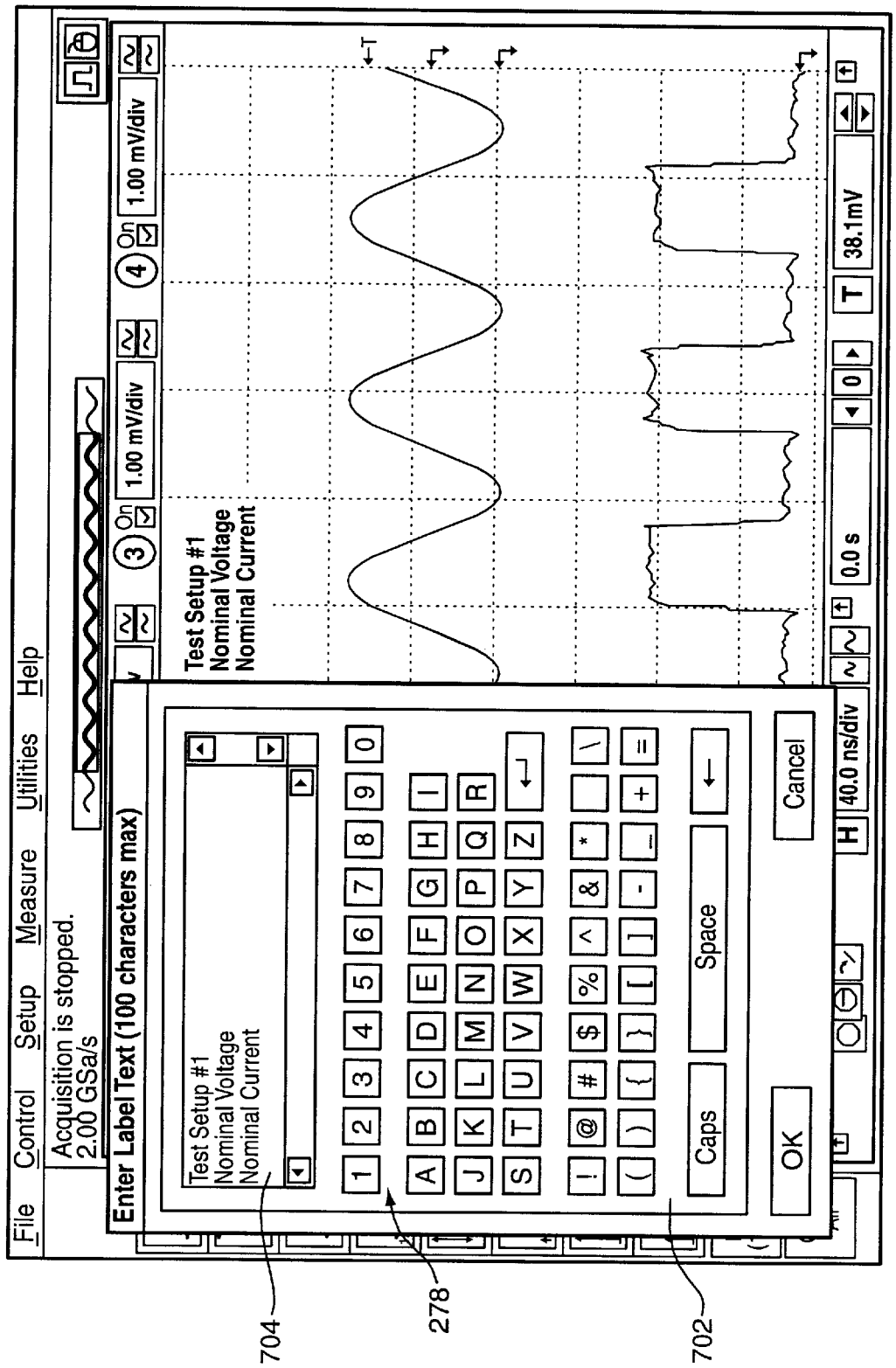
FIG. 7 is an illustration of a graphical user interface showing a label content entry dialog box displayed in accordance with one embodiment of the present invention.
Figure 8:
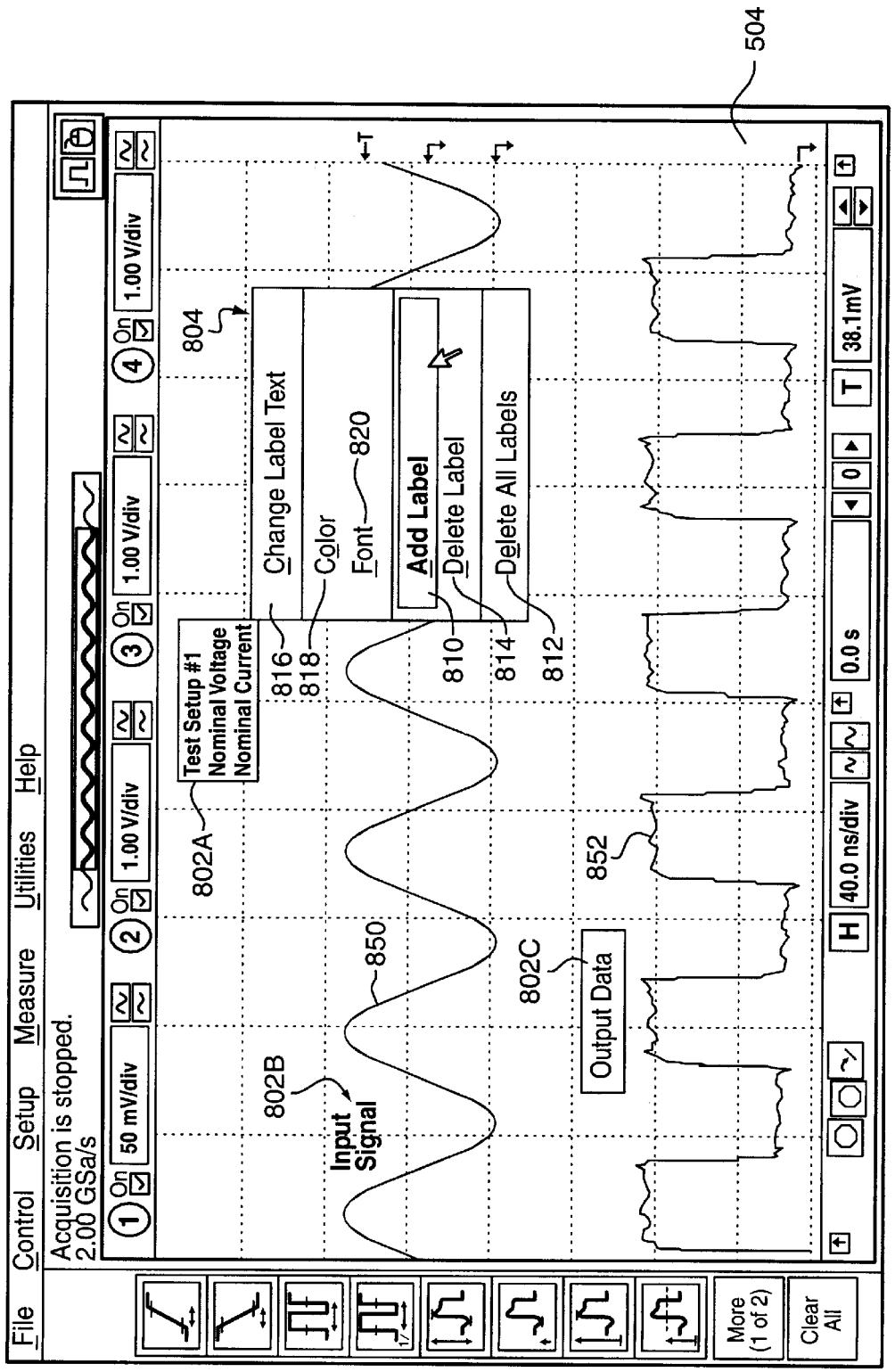
FIG. 8 is an illustration of a graphical user interface showing annotation labels created in accordance with one embodiment of the present invention along with a label modification menu displayed in accordance with one embodiment of the present invention.
Figure 9:
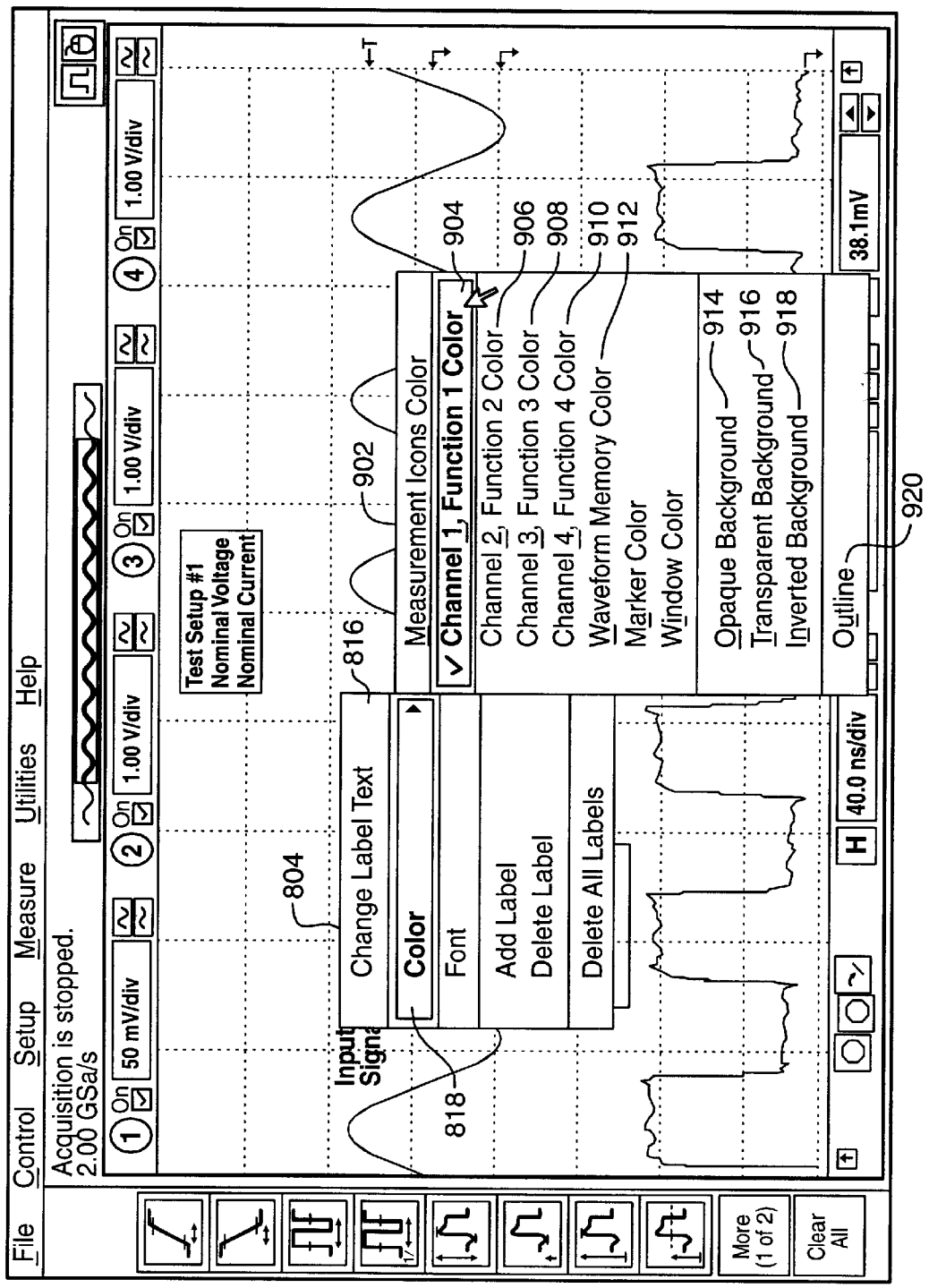
FIG. 9 is an illustration of a graphical user interface showing an color menu displayed in accordance with one embodiment of the present invention.

FIG. 5 is an illustration of a graphical user interface showing an annotation label instruction dialog box displayed in accordance with one embodiment of the present invention. FIG. 6 is an illustration of a graphical user interface showing a general instruction menu list that includes a menu option associated with the present invention. FIG. 7 is an illustration of a graphical user interface showing one embodiment of a label content control dialog box. FIG. 8 is an illustration of a graphical user interface showing a multiple annotation labels along with a label modification menu list displayed in accordance with one embodiment of the present invention. FIG. 9 is an illustration of a graphical user interface showing an exemplary color options menu list.

System 118 broadly includes annotation label manager 202 and a plurality of label control units 204. Each label control unit 204 is constructed and arranged to manage the display and graphical interactivity with, an associated annotation label rendered on graphical user interface 116. Each label control unit 204 provides the operator with the capability to determine the content of the associated annotation label, the location of the annotation label on a display and, preferably, the appearance, size and shape of the annotation label. Each label control unit 204 is preferably a logical association of software code such as one or more modules in a structured programming language such as the C programming language. In one preferred embodiment, label control units 204 include objects of one or more object classes in an in an object-oriented software language, such as the C++ programing language. Annotation label manager 202 manages label control units 204, primarily providing centralized control over the invocation and removal of label control units 204 and, hence, of the display of the associated annotation labels. Preferably, the current state of the annotation labels is maintained for availability to other portions of the implementing system. To achieve this, annotation label manager 202 maintains centralized control of annotation label state information. Such an embodiment may be implemented, for example, to provide a central repository that may be accessed during initialization of system 100, providing for the continued maintenance of the annotation label states through subsequent test and evaluation sessions. In certain embodiments, different state information may be stored separately in different files on a storage medium such as those noted above to enable the implementing system to be configured for different operators, test scenarios or the like.

As noted, in accordance with embodiments of the present invention, a number of dialog boxes and the like are displayed on graphical user interface 116 to provide the operator with the capability to control the addition and removal of annotation labels, as well as to modify their position, content, etc. When a dialog box or other display element is provided in association with an annotation label, function calls or commands generated by graphical user interface 116 due to an operator interaction with such display elements are provided to the label control unit 204 associated with that annotation label. On the other hand, when graphical user interface 116 generates function calls or commands due to the operator's interaction with general instruction dialog boxes or other display elements not displayed in connection with a particular annotation label, then those function calls and commands are provided to annotation label manager 202.

In accordance with the embodiment of the present invention in which annotation label manager 202 does and does not maintain the state of the annotation labels, all commands and function calls provided to label control units 204 from graphical user interface 116 relevant to the creation and deletion of associated annotation labels are not processed by label control units 204 themselves. Instead, label control units 204 are constructed and arranged to forward such commands and function calls to annotation label manager 202 for processing. As will be explained in detail below, annotation label manager 202 generates system calls to operating system 114 to instantiate and destroy label control unit objects in accordance with the creation and deletion requests presented by graphical user interface 116.

In addition, in accordance with certain embodiments of the present invention, graphical user interface 116 generates dialog boxes, windows, menu lists, icons or the like which are associated with the present invention. Configuration of graphical user interface 116 and/or operating system 114 to generate such windows, dialog boxes and the like is considered to be well known in the art. The inclusion of menu items, button, icons or other display elements for invoking functions of annotation system 118 in such display windows, menu lists, dialog boxes, etc., is also considered to be within the purview of those of ordinary skill in the art and, therefore, has not been described in detail herein.

Furthermore, label control units 204 interoperate in a well known manner with graphical user interface 116 to render dialog boxes, annotation labels, and other graphical items of the present invention. The function and operations performed by label control units 204 to maintain communication with graphical user interface 116 to render display elements of the present invention is considered to be well known in the art and, therefore, not described herein nor illustrated in the Figures for clarity.

The structure and operation of annotation system 118 with respect to the creation and deletion of annotation labels is described immediately below. This is followed by a description of the initial display of annotation labels, including default values of the appearance, location and content of the annotation labels. Once the initial display of annotation labels has been described, the location of the annotation labels, which affects the applied default values as well as the freedom to drag the annotation labels across graphical user interface 116 is described. This is followed by a description of the structures and functions of the present invention associated with providing the operator with the capability to alter the rendering options to change the appearance of the annotation labels as well as the substantive content of the annotation labels.

There are a number of commands related to the addition of a new annotation label or the deletion of all annotation labels. Such commands are non-label specific commands in that they apply to all annotation labels or to annotation labels that do not yet exist. Specifically, in the illustrative embodiment, non-label-specific commands are generated by graphical user interface 116 upon selection of icons, menu items or other display elements presented on graphical user interface 116 in accordance with embodiments of the present invention. These display elements are illustrated in the exemplary graphical user interface displays shown in FIGS. 5, 6 and 8.

Referring to FIG. 5, a "Display Labels" dialog box 502 is shown displayed in accordance with one embodiment of the present invention. The display 500 presented by graphical user interface 116 includes a waveform display region 504 and a number of information and control menus surrounding waveform display region 504. For example, a channel status display region 516 is displayed at the periphery of the waveform display region 504. In the illustrative example shown in FIG. 5, a single waveform is displayed in the display region 504: a channel 1 waveform at 200 mV/div as shown in the channel status display region 516. A measurement toolbar 518 providing the operator with the ability to graphically select and apply any desired measurement is provided. Each measurement is graphically depicted as a selection button. Similarly, horizontal scale information is provided at a toolbar 520.

Dialog box 502 is displayed in response to the operator graphically selecting a menu item on a "Display Setup" dialog box 506 shown partially hidden in FIG. 5. This dialog box 506 is displayed in response to the selection of a menu item on a pull down menu displayed in response to the selection of a "Setup" option on menu 512.

Dialog box 502 provides two icons illustrated in the form of graphical selection buttons. The operator may graphically select either of these two buttons using a pointing device to control the cursor, and a select switch for selecting the desired button when the cursor is positioned over the desired button. Selection of "Add Label" button 508 causes graphical user interface 116 to generate add label command or function call 222. Selection of "Delete All Labels" selection button 510 causes graphical user interface 116 to generate a delete all labels command 224. As shown in FIG. 2, these commands are received by annotation label manager 202 since, as noted, they are non-label-specific commands.

In accordance with one preferred embodiment, and as shown in FIG. 5, dialog box 502 also provides initial instructions to familiarize the operator with regard to how to generate annotation labels in accordance with the implemented embodiment of the present invention. As noted therein, in the illustrative embodiment, annotation labels may also be added by right-clicking the pointing device in the waveform display area 504 or by right clicking on an annotation label currently displayed on graphical user interface 116. Both of these approaches are described below.

Regarding the former, right-clicking in waveform display region 504 causes graphical user interface 116 to display a general instruction menu list 602. One exemplary embodiment of general instruction menu list 602 is illustrated in FIG. 6. Menu list 602 includes a plurality of menu items including menu item 604 entitled "Add Label." Selection of this menu item causes graphical user interface 116 to generate add label command 222. Other menu items not pertinent to the present invention are also shown on display list 602.

Regarding the latter, FIG. 8 illustrates one embodiment of a label modification menu 804 which is generated by graphical user interface 116 when the operator right clicks the pointing device while the cursor is positioned over an annotation label. In the exemplary waveform display shown in FIG. 8, three annotation labels 802A, 802B and 802C (collectively and generally referred to as annotation labels 802) are shown displayed in waveform display region 504. Adjacent to a label 802A is a label modification menu 804 generated by graphical user interface 116 in response to an operator's right-click of the pointing device while the cursor is positioned over annotation label 802A. Menu 804 is visually associated with annotation label 802A through proximate rendering of the menu 804.

There are two non-label-specific menu items on menu 804: an "Add Label" menu item 810 and a "Delete All Labels" menu item 812. Selection of "Add Label" menu item 810 causes graphical user interface 116 to generate add label command 254. Similarly, selection of "Delete All Labels" menu item 812 causes graphical user interface 116 to generate delete all labels command 256. Such commands are received by label control unit 204 that generated annotation label 802A. However, as noted, such label creation/deletion commands are not acted on directly by label control unit 204. Instead, they are forwarded to annotation label manager 202 for processing. This data transfer is shown in FIG. 2 as delete all labels signal 232 and new label signal 230 being generated by label control units 204 and being received by annotation label manager 202. Thus, label manger 202 may receive a command to generate a new label or delete all labels directly or indirectly from graphical user interface 116.

In addition to these non-label-specific commands, graphical user interface 116 also generates a delete label(id) command 258 when the operator selects "Delete Label" menu item 814 on menu 804. Since label modification menu 804 is associated with a specific annotation label (in this case, annotation label 802A), delete label command 258 generated by graphical user interface 116 includes an label identifier (id) identifying the label control unit 204 that generated annotation label 802A as the label control unit 204 which is to be deleted. As with the above creation/deletion commands received from graphical user interface 116, label control units 204 forward such a command to annotation label manager 202. As shown in FIG. 2, label control units 204 generate a delete label (ptr) signal 234 to provide annotation label manager 202 with the information that the identified label control unit object is to be destroyed.

It should be understood that the above-noted menu lists, dialog boxes and other specific display elements presented on graphical user interface 116 to provide the operator with the capability of invoking certain functions of the present invention are a matter of design choice only; any other arrangement may have been used with equal effectiveness. For example, one of the pull-down menu lists displayed in response to the selection of a display element on main menu bar 516 (File, Control, Setup, . . . ) may include a menu item related to the present invention. In addition, fewer selection options to invoke, for example, the operation of adding a label or deleting all labels may be provided. Such implementation variations are considered to be well within the scope of the present invention.

In response to new label request function calls 222, 230 and delete label request function calls 224, 232, 234, annotation label manager 202 generates corresponding system calls to operating system 114. Specifically, annotation label manager 202 generates a create label system call 246 in response to new label request function calls 222, 230 and generates a delete label system call (ptr) 250 in response to delete label request function calls 224, 232, 234. Delete label system call 250 includes a pointer to the currently active label(s) 204 which are to be deleted. Such pointer may include a pointer to all currently active label control units 204 if annotation label manager 202 is generating system call 250 in response to a delete all labels request function call 224 or 232, or the pointer parameter may include an address of a single label control unit 204 when the system call 250 is generated in response to a selected label request 234. The deletion of an annotation label simply results in operating system 114 destroying the instantiation of the object in which the identified label control unit is embodied, causing the removal of associated annotation label 802 from waveform display 504.

As noted, embodiments of annotation label manager 202 also perform certain operations to maintain substantially complete state information with regard to the displayed annotation labels including, for example, location, content, appearance, etc. Such an embodiments may be implemented, for example, to provide a central location that may be accessed during initialization of the system, providing for the continued maintenance of annotation label configurations through subsequent test and evaluation sessions. Preferably, the label state information is made available to graphical user interface 116 or other requesting system through a label sate data structure 320. These features of annotation label manager 202 will be described in detail below.

As noted, the above description will now be followed by a description of the initial rendering of annotation labels 802. In accordance with one preferred embodiment, annotation system 118 enables the operator to select the location, content and appearance of annotation labels 802. In accordance with the illustrative embodiment, these characteristics are initially determined by default values provided to annotation system 118 as part of new label request function calls 222, 254. The operator has an opportunity to change the values subsequent to the initial creation of the resulting annotation label.

Function calls 222, 254 are parameterized function calls, the parameters of which include the default values for the initial rendering of an annotation label. These parameters will be described in detail below with respect to a label state data structure 320 maintained by certain embodiments of annotation label manager 202 that stores appearance, content and location state information for each of the currently displayed annotation labels 802. A schematic diagram of one embodiment of data structure 320 is illustrated in FIG. 4.

Referring now to FIG. 4, label state data structure 320 may take on any form, such as C++ data structure, linked lists or the like. Data structure 320 is organized as a list of entries, each such entry representing the current state of an annotation label displayed on graphical user interface 116.

For each entry in data structure 320, there is provided a label number 422 uniquely identifying the annotation label 802. Label data structure 320 is organized according to label number 422 since annotation label manager 202 assigns a unique label number to each new annotation label when it is created. Data structure 320 also includes a label pointer 424 providing the address of label control unit 204 that generated this annotation label 802, and location 406 that includes the x-y pixel position on display 112. Data structure 320 also includes label content 408, rendering information 410 and, preferably, a reference symbol 420 to enable the operator to visually link the annotation label 802 with specific regions of a displayed waveform or other display element.

Entry 402 in data structure 320 illustrates one embodiment of the above-noted default values provided in new label function calls 222, 254. Each of the parameters will be described below. As shown by entry 404, the default text is "Label n (right click for options)" where "n" is the next available label number. That is, if there are currently five labels displayed and a new label is created, the label number will be 6 and the default text will be "Label 6." The text "(right click for options)" prompts the operator to consider whether the default parameters are desired or whether they are to be changed. It should be understood that any or no default text may be used in alternative embodiments. Label content 410 may include text as indicated by text entry 402, or graphics, as indicated by entry 404. Any type and format graphics file may be used.

Rendering options, as noted, include those parameters related to the appearance of the annotation label when rendered on graphical user interface 116. Rendering information 410 includes, in this embodiment, text color 412, background color 414, outline 416 and font 418. Recall that rendering options are not necessarily provided in every embodiment of the present invention.

With regard to the specific values for rendering information 410, text color 412 defaults to black while background color 414 defaults to white. Label outline 416 defaults to off. Default values for font 418 may include font type as well as font point size. In one embodiment, the font type cannot be set by the operator and two font sizes are provided: large and small. In such an embodiment, font 418 defaults to the large font as shown in FIG. 4.

In one preferred embodiment, the default values for rendering options 410 are dynamically maintained during the operation of the implementing system 100, tracking the operator's last selections to anticipate current desires and reduce the number of operations the operator may perform. In accordance with this embodiment, default values for rendering options 410 are those values most recently selected by the operator for another annotation label 802. Thus, default values for rendering options 410 may be values provided at system initialization when the operator has not previously altered the rendering values for this or any other annotation label. If the operator has made such alternations, such new rendering values are stored locally as new default values and are subsequently provided for subsequent annotation labels as they are created. This approach is preferred since it is more likely that the operator will desire to have the rendering information values of a newly created annotation label to be the values that the operator last selected for a previous annotation label as compared to the preset values applied at system initialization.

As noted, in certain preferred embodiments, a reference symbol 420 is also provided in system 118 to enable the operator to establish visual association between annotation label 802 and the feature or display element addressed in content 408 of the annotation label. Such a graphical pointer or reference line enables the operator to specifically identify a very small region or perturbation of a displayed waveform.

In one embodiment, such reference pointers may be implemented as graphical directional symbols or icons which extend from a predetermined side of the label rectangle and point in a predetermined direction may be included. These may simply be 4 selections (above, below, right and left) or more, such as 8 directions (north, northeast, east, southeast, south, southwest, west and northwest) or 12 (one o'clock, two o'clock, etc.). For example, if an annotation label 802 has as a topic a measurement waveform feature positioned below the label, a user may simply select a "reference pointer" menu item and from the resulting displayed list of menu items, select "below," "south," or "6 o'clock," whichever the case may be. In one embodiment, the arrows are of a fixed distance. Alternatively, a palate of many reference pointers of many sizes and directions is provided. The reference pointer defaults to none as shown in FIG. 4.

The x-y location 406 of each annotation label 802 on waveform display 504 is the value of the origin of the annotation label (upper left corner of the label rectangle). The new label command 222, 230 has default values indicating the initial location 406 of the origin of annotation label 802 on waveform display 504. This default value may be any x-y value. In accordance with one embodiment of the present invention, new annotation labels 802 are located close to the anticipated location desired by the operator. Here, the default value of x-y location 406 is set to (0,0) in new label command 222 when "Add Label" selection button 508 is selected on Display Labels dialog box 502. This places annotation label 802 at the origin (upper left corner) of waveform display 504. Dialog box 502 is displayed initially upon operator selection of system 118. Therefore, this is likely to be the first annotation label 802 created by the operator.

On the other hand, when "<u>A</u>dd Label" menu item 810 is selected on a menu 804 associated with a particular annotation label 802 currently displayed on waveform display 504, the initial location value of the annotation label is the current position of the cursor at the time the menu item 810 is selected. This information is provided to the associated label control unit 204 via mouse motion function call 252. Function call 252 includes a number of parameters, including the x-y location of the cursor along with the state of the selection. Since there may be more than one annotation label currently displayed, and therefore used to create a new annotation label, it is presumed that the operator selected the annotation label which is closest to the desired location of the new annotation label.

If the operator creates multiple new annotation labels in succession without moving any of the previously created annotation labels, all such new annotation labels will be initialized at the origin of waveform display 504, likely to be rendered so as to obscure those beneath it. It may then be difficult to move a particular desired annotation label which is rendered beneath a later-created annotation label. To avoid this from occurring, one embodiment of annotation system 118 accesses the current state information of each existing label to determine its location and size. If there is a positional conflict, annotation system 118 generates a move label command 240 to label control unit 204 which has most recently been created to change the location of the associated annotation label from the default location (waveform display region origin) to another location. In one preferred embodiment, the position of the newly created annotation labels are offset from the previously created annotation labels to create a cascaded rendering of the new labels. This provides a sufficient amount of exposed area of each annotation label so that the operator can easily position the cursor over a desired annotation label and graphically move it to a desired location within the waveform display region 504.

Preferably, the same approach is used when multiple annotation labels 802 are created through the selection of " Add Label" menu item 810 on a menu 804 provided with the same annotation label 802. In such circumstances, all newly created annotation labels 802 will be at the location of the cursor which may be at substantially the same location when the add label menu item 810 is selected. Here too, it is desirable to initially render new annotation labels in a cascaded fashion if necessary to avoid positional conflicts. In one embodiment, if there is any overlay of annotation labels, they are cascaded without further determinations being performed. In an alternative embodiment, a region surrounding the origin of each initialized annotation label is determined, in which the origin of no other annotation label may be located. This region is determined based upon the requisite area of the exposed portion of the previously-created label which should be displayed to enable the operator to easily position a cursor over that annotation label to drag it to another, more desirable location.

As noted above, location 406 of annotation labels 802 will now be described. In the illustrative embodiment, annotation system 118 restricts the location of annotation labels 802 to locations entirely within waveform display region 504. Graphical user interface 116 displays other elements such as toolbars, menu bars and the like in addition to waveform display region 504. Annotation labels 802 created in accordance with the present invention are associated with waveforms and waveform features displayed in waveform display region 504, not with other display elements of graphical user interface 116. By restricting location 406 of annotation labels 802 to locations within waveform display region 504, annotation labels 802 are prevented from being rendered so as to interfere with the view and/or access of other, unrelated display features, such as toolbars, menu bars and the like.

The restriction of annotation labels 802 to locations within a waveform display region is considered when the annotation labels are initially created as well as when the operator moves or changes the size of an annotation label 802. An annotation label 802 may be changed in response to the operator selecting a different font or changing the content of the label. Generally, the operator drags an existing annotation label 802 across waveform display 504 using the pointing device provided. This information is provided in a mouse motion command 252 generated by graphical user interface 116. Thus, the initial location value and the current cursor position are analyzed to determine if the annotation label may be placed at that location on the display.

Since systems beyond annotation system 118 determine and store information regarding the current display arrangement, rectangle limits data 226 is obtained from an external source. In the illustrative embodiment illustrated in FIG. 2, rectangle limits data 226 is provided by graphical user interface 116. Rectangle limits command 226 provides the dimensions of waveform display region 504 in which annotation labels 802 may be positioned. In certain embodiments of system 100, more than one waveform display region 504 may be presented on graphical user interface 116. For example, two waveform display regions separated by a permanent control bar may be presented. In such embodiments, rectangle limits 226 includes the dimensions of the two waveform display regions in which annotation labels 802 may be located. Annotation label manager 202 provides this information to label control units 204 via rectangle limits command 238.

Label control units 204 utilize this information to prevent the operator from dragging or otherwise moving the associated annotation label outside of waveform display region 504. To control the location of annotation labels 802, label control units 204 require not only the origin location of each annotation label 802, but the size as well. The size is initially determined by annotation label manager 202 based on the selected font and default text. This is provided to the individual label control units 204 in the size label command 244.

Each label control unit 204 compares the current size and proposed location of annotation label 802 to the waveform display region rectangle limits to determine whether any portion of the annotation label 802 would extend beyond the boundaries of waveform display region 504. If so, label control unit 204 determines a new location 406 within waveform display region 504 that enables each annotation label 802 to be completely rendered within the boundaries of the waveform display 504. One embodiment of the processes performed by the label control units 204 to derive this new location 406 is described in detail below with reference to FIGS. 10–14.

The rendering options and substantive content of annotation labels 802 will now be described with reference to FIGS. 2 and 7–10. As will be explained in detail below, annotation label manager 202 maintains the displayed content, location and rendering options of each annotation label 802 presented on display 112. Annotation label manager 202 updates this information as label control units 204 are created and deleted, as well as when their configuration is altered by the operator. The latter process will now be described.

The operator can select various rendering options for each annotation label displayed on waveform display 504. Referring to FIG. 8, these rendering options are provided to each label control unit 204 through graphical selection of the desired menu options on label control menu 804. Menu 804 includes three menu items associated with changing the content or appearance of a displayed annotation label 802. They are "Color" menu item 818, "Font" menu item 820 and "Change Label Text" menu item 816. Modification of annotation label appearance is described first, followed by a description of the selection and modification of annotation label content.

A rendering change function call 272 is generated by graphical user interface 116 in response to the graphical selection of menu items 818 and 820. In certain embodiments rendering change request 272 is a parameterized command while in others it represents a series of individual commands. Rendering change request function call 272 includes various display option parameters identifying those that the operator has requested to be changed. In one embodiment, these parameters include the rendering options 410 discussed above with reference to label state data structure 320.

With regard to color selection, in one preferred embodiment, the operator is provided a series of dialog boxes in which to select or otherwise provide the desired rendering options. For example, a shown in FIG. 9, a label modification menu 804 is shown with color menu item 818 highlighted. In this example, the color menu item was selected by the operator, such as be clicking the appropriate mouse button or depressing the return key on a keyboard when the menu item 818 is highlighted. This, as shown, causes graphical user interface 116 to display an appearance menu dialog box 902. Dialog box 902 includes a series of menu items each of which addresses a particular appearance-related option that may be selected by the operator.

In this exemplary embodiment, menu display list 902 provides the operator with the opportunity of changing the color of the annotation label to assume the color of any of the displayed waveform colors by selecting the associated menu item 904–912. Alternatively, selection of a menu item may cause a palate of colors to be displayed for selection of the desired label text and background colors for the desired annotation label.

In one embodiment, annotation label 802 may be rendered in one of three background transparency styles: opaque, inverted, and transparent, as determined by selection of menu items 914, 916 and 918, respectively. Opaque results in annotation label having a background rendered in a designated color, with the annotation label obscuring anything that is behind it. Transparent results in blank regions on the annotation label being rendered such that underlying waveform data to visible through the annotation label. Inverted results in the text and background colors switch roles. In alternative embodiments, additional options may be provided. For example, in one alternative embodiment, dialog box 902 provides the operator with the capability of selecting an additional selection of the annotation label 802 being translucent. Translucent is a semitransparent pattern wherein the annotation label 802 background is rendered such that every other pixel allows the waveform data to be visible. The operator also is provided with a menu item 920 to select whether the annotation label is to be outlined. That is, a border may be drawn around the annotation label rectangle, providing further rendering flexibility.

FIG. 8 illustrates three annotation labels 802 rendered differently for illustrative purposes. Channel 1 waveform 820 is a sine wave rendered in a predetermined color. Annotation label 802B is rendered with a text of the same color as waveform 820, and a transparent background color. This provides for a visual association between the displayed waveform 850 and the annotation label 802C. Similarly, the channel 2 waveform 852 is rendered in a second color. The associated annotation label 802C is rendered with a black text color or a background color the same as the second color. This provides another technique for visually associating a waveform and its associated annotation label. Annotation label 802A is not associated with either waveform 850, 852, but identifies the conditions under which the test is being performed. This annotation label has text that is colored black rendered on a background that is colored white.

The modification of the content 408 of the annotation labels 802 will now be described in detail below with reference to FIGS. 2, 8 and 9. To change the text of a displayed annotation label, the operator may right click on the label and select from the resulting menu 804 the "Change Label Text" menu item 816. In response, graphical user interface 116 generates a text change request command 274 to the label control unit 204 for which the dialog box 802 is displayed. Upon receipt of this request, label control unit 204 causes the display of a text entry dialog box 278, specifically called out in FIG. 2. An example of dialog box 278 is illustrated in FIG. 7.

In one embodiment, this exemplary embodiment of text entry dialog box 278 is not displayed when the operator initially creates an annotation label 802 as noted above. Instead, the new annotation label is rendered with a default text notifying the operator that the annotation label content 408 may be changed. In an alternative embodiment, the text entry dialog box 278 may be displayed automatically by label control units 204 upon their instantiation by annotation label manager 202.

If the text entry dialog box 278 is displayed due to the selection of the "Change Label Text" menu item 816, the current content 408 is displayed in the command entry field 702 of the dialog box 278. The operator can then edit the displayed text using the graphical keyboard 704 or physical keyboard 108. With the keyboard 108 the operator enters text key strokes 262 which are provided to dialog box 278. The operator may then depress the return or escape key, an indication of which is provided to the text entry dialog box 278 via the ok/cancel command 260. Similarly, the operator can enter the desired text via graphical keypad 704 provided in text entry dialog box 278. This information is provided to text entry dialog box 278 via the text command 264. Selection of a cancel button or ok button is also provided to the text entry dialog 278 via the ok/cancel command 266.

Upon receipt of the OK or cancel command 260, 266, dialog 278 forwards the new text to the label control units 204 via the new text command 268. If cancel is selected, then dialog 278 writes the current text back to label control unit 204. Once the individual label control unit 204 changes the text 270 accordingly, the information is provided to the label manger 202 via the label text command 280.

In an alternative embodiment, icons may be used in addition to OK instead of text. Here, the operator may select particular representative icons that would represent some launched text field that is associated with that icon. A predesigned dictionary of text with an associated icon may be stored for display for selection by the operator.

Following in greater detail is a description of the functions, structure and operations of the annotation label manager 202 and label control units 204. FIGS. 3A and 3B are functional block diagrams of one embodiment of label manger 202 and label control unit 204, respectively. Referring first to FIG. 3B, the illustrative label control unit 204 includes a command processor 250, a display controller 252 and a position controller 254. Command processor 350 routes function calls and commands in accordance with one embodiment of the present invention. In particular, command processor 350 receives function calls from graphical user interface 116 as described above. In the illustrative embodiment, these function calls include add label 254, delete label 258, delete all labels 256 and rendering change 272. Command processor 352 routes these function calls to annotation label manager 202 to enable annotation label manager 202 to perform operations associated with the creation and removal of label control units 204, as well as to maintain centralized control over label state information, as dictated by certain embodiments of the present invention. Upon receipt of one or more of the above-noted signals 238–244 from annotation label manager 202, command processor 350 forwards certain commands to display controller 252 and others to positional controller 354. It should be understood that any technique now or later developed may be used to transfer such information among the components of label control unit 204. As shown in FIG. 3B, command processor 250 also passes through other commands received from graphical user interface 116 to display controller 252 and position controller 354, including mouse motion 252, text change request 274, rendering change 272 and reference pointers 276.

Display controller 352 performs well known operations associated with the display and control of the associated annotation label on graphical user interface 116. Display controller 352 is constructed and arranged to control the position and operator interactivity with the associated annotation label on graphical user interface 116. As noted, in one embodiment display controller 352 implements the associated annotation label 802 as a simple dialog box. In other embodiments, annotation labels 802 are implemented as windows. Interoperating with operating system 14 and graphical user interface 116 to render windows on graphical user interface 116 is considered to be within the purview for those of ordinary skill in the art. Accordingly, the structure, functions and operations of display controller 352 is considered to be well known in the art and, therefore, is not described further herein.

Position controller 354 controls not only the location of the associated annotation label 802, but the size of the label as well. Position controller 354 receives rectangle limits 238, move label commands 240 and size label 244 commands from label manger 202. Position controller 354 also receives mouse motion 252 generated by graphical user interface 116. Based on these inputs, position controller 354 determines whether the location of the annotation label 802, as proposed by a current cursor position or default value, is within the boundaries of a waveform display region 504. Position controller 354 also determines whether annotation label 802 is too large for the waveform display region and, if so, adjusts the size of the label accordingly. This is described in greater detail below with reference to FIGS. 10–14. As with display controller 352, a description of the manner in which position controller 354 interoperates with operating system 114 and graphical user interface 116 to effect the above functions is considered to be well known in the art and, therefore, is not described further below.

Referring to FIG. 3A, annotation label manager 202 broadly includes an annotation label generation control unit 302 and an annotation label control unit 204. As shown in FIG. 3A, annotation label manager 202 shares an interface with operating system 114. Annotation label manager 202 also shares an interface with graphical user interface 116 directly or indirectly through label control units 204. For ease of illustration, all information generated by graphical user interface 116 that is received by annotation label manager 202, whether directly or indirectly, is shown as part of the interface between annotation label manager 202 and graphical user interface 116, which is rendered as a dashed block in FIG. 3A.

Generation control unit 302 instantiates and destroys label control units 204 based on externally-generated function calls, which, as noted, are generated in response to operator requests in the illustrative embodiment. When an annotation label 802 is to be created, generation control unit 302 determines the initial location, content and, preferably, appearance of the created annotation label. Generation control unit 302 provides this information to annotation label maintenance unit 304 for centralized maintenance of the state of the annotation labels 802 and for forwarding the information to the appropriate label control unit 204. Generation control unit 302 receives new label function calls 222, 230, delete label function call 234 and delete all labels function calls 224, 232. In response to the delete label function calls 234 and 224, 232, generation control unit 302 generates a delete label system call 250 to operating system 114 to destroy the indicated instantiation of label control unit 204.

Generation control unit 302 generates system calls 246 to operating system 114 to instantiate a label control unit 204 upon receipt of new label function calls 222, 230. In one embodiment, this is a system call to instantiate a new label class object. Operating system 114 returns a label pointer 248 identifying the location of the newly instantiated label control unit object. Generation control unit 302 forwards this pointer to maintenance unit 304 as part of label information 310 for storage in label state data structure 320 as noted above.

As noted, generation control unit 302 stores annotation label default values in default values data structure 306. These values may be set at initialization or dynamically updated. Generation control unit 302 receives label state information as it is updated from maintenance unit 304 via label information signal 310. This signal 310 contains updated information regarding the annotation label size, location, appearance, etc. Generation control unit 302 stores that information which is to be dynamically updated in the default values data structure 306.

When creating new annotation labels, generation control unit 302 determines initial values for rendering an annotation label 802. Generation control unit 302 retrieves default values for annotation label content 408 and rendering options 410, and calculates an initial position for label location 406. This information is forwarded to maintenance unit 304 with the label pointer 424 received from operating system 114 and a unique label number 422. Maintenance unit 304 stores this information in label state data structure 320 described above.

Generation control unit 302 determines a unique initial position of annotation label 802 in waveform display region 504. As noted, this value may either be the waveform display region origin or a current cursor position, depending on the context in which the annotation label is being created. Successive generation of new annotation labels may result in positional conflicts between the annotation labels. Generation control unit 302 avoids such conflicts by accessing label state data structure 320 through maintenance unit 304 for the position of all currently displayed annotation labels. The size and position of the newly created annotation label is compared with those annotation labels currently displayed. Using any desired technique, generation control unit 302 determines whether the new annotation label is interfering with the viewing and access of the currently rendered annotation labels and, if so, modifies the default location values to avoid such positional conflicts.

Maintenance unit 304 maintains label state data structure 320 as described above. Maintenance unit 304 receives rendering information 236 from graphical user interface 116 and, as noted, forwards such information to generation control unit 302 as part of updated information 312. In addition, maintenance unit 304 updates label state data structure 320 with such information to maintain the current state of all annotation labels displayed on graphical user interface 116.

Maintenance unit 304 also generates move label and size label commands 240, 244 to label control units 204 to position and size the associated annotation label 802. These commands include default or modified default values calculated by generation control unit 302 and provided to maintenance unit 304 as part of label information command 310. In addition to updating label state data structure 320, maintenance unit 304 generates the move label and size label commands 240, 244.

Annotation label manager 202 also includes a redraw logic unit 308 and a limit rectangles logic unit 314. As noted, redraw all labels command 228 is generated by graphical user interface 116 in response to the occurrence of certain global conditions that warrant annotation labels 802 to be rendered again on graphical user interface 116. Such global conditions may include, for example, a color change event. The signal 228 is received by redraw logic unit 308. Redraw logic 308 accesses label list 320 for every label pointer 424 and issues a re-draw command 242 to each identified label control unit 204, causing label control units 204 to re-draw their associated annotation labels 802.

Limit rectangles logic unit 314 receives rectangle limits 226 from graphical user interface 116. Limit rectangles logic unit 314 simply stores these values and forwards them to each label control unit 204 in rectangle limits command 238.

Preferably, the annotation label state information stored in data structure 320 is globally available. This information may then be recalled as part of the implementing system's set up procedure. This enables the setting established by an operator to be saved for subsequent uses of the implementing system. As one skilled in the art would find apparent, an operator can save system set up configurations. This causes the capture of designated states of the system. For systems, for example, this includes all control settings, scale factors, active channels, and the like. In accordance with one embodiment of the present invention, the annotation labels are also stored and recalled as part of a previous set up for subsequent recall. This information may also be stored in individual files to implement different configurations for different circumstances, such as different test procedures, different operators, and the like.

Figure 10:
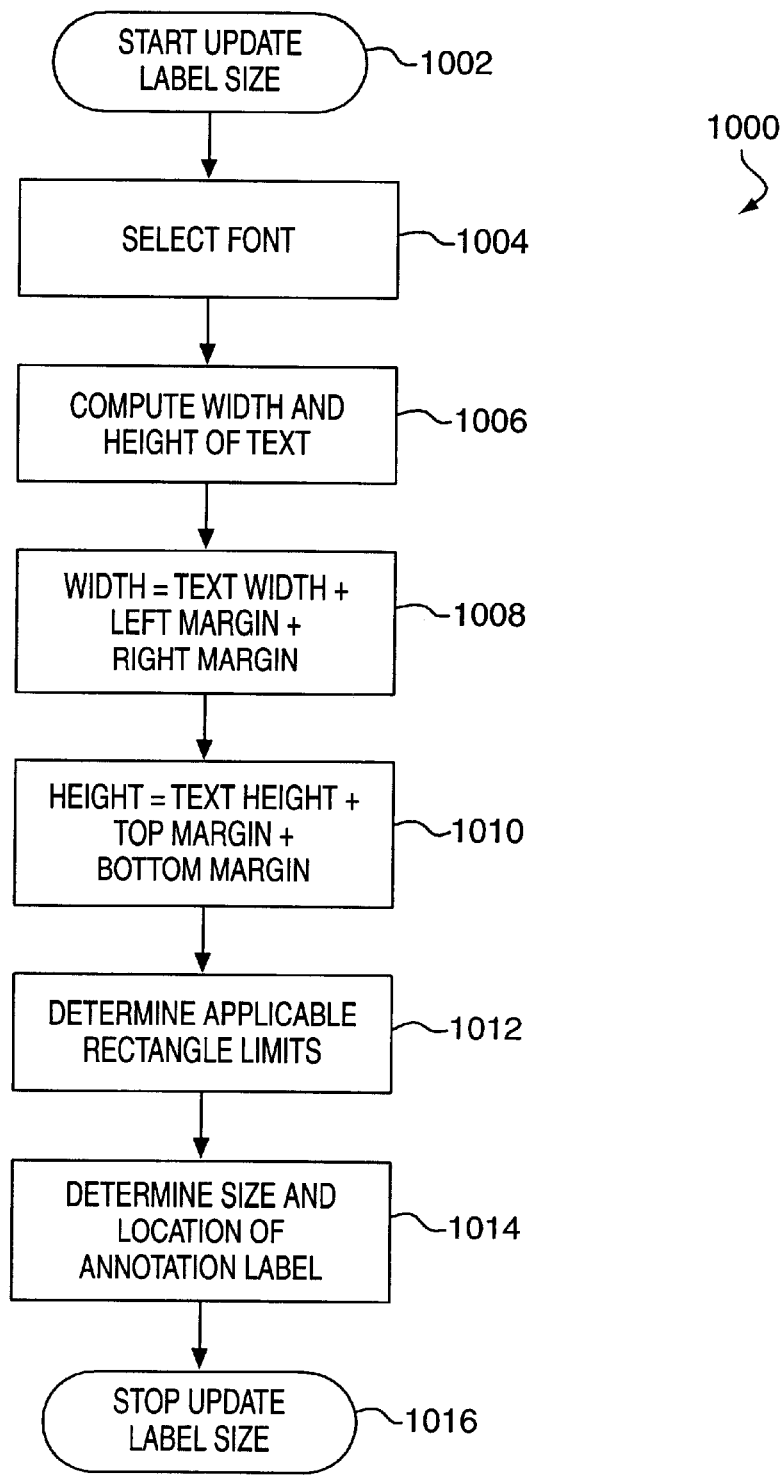
FIG. 10 is a flow chart of one embodiment of an update label size process performed in certain embodiments of the present invention.
Figure 11:
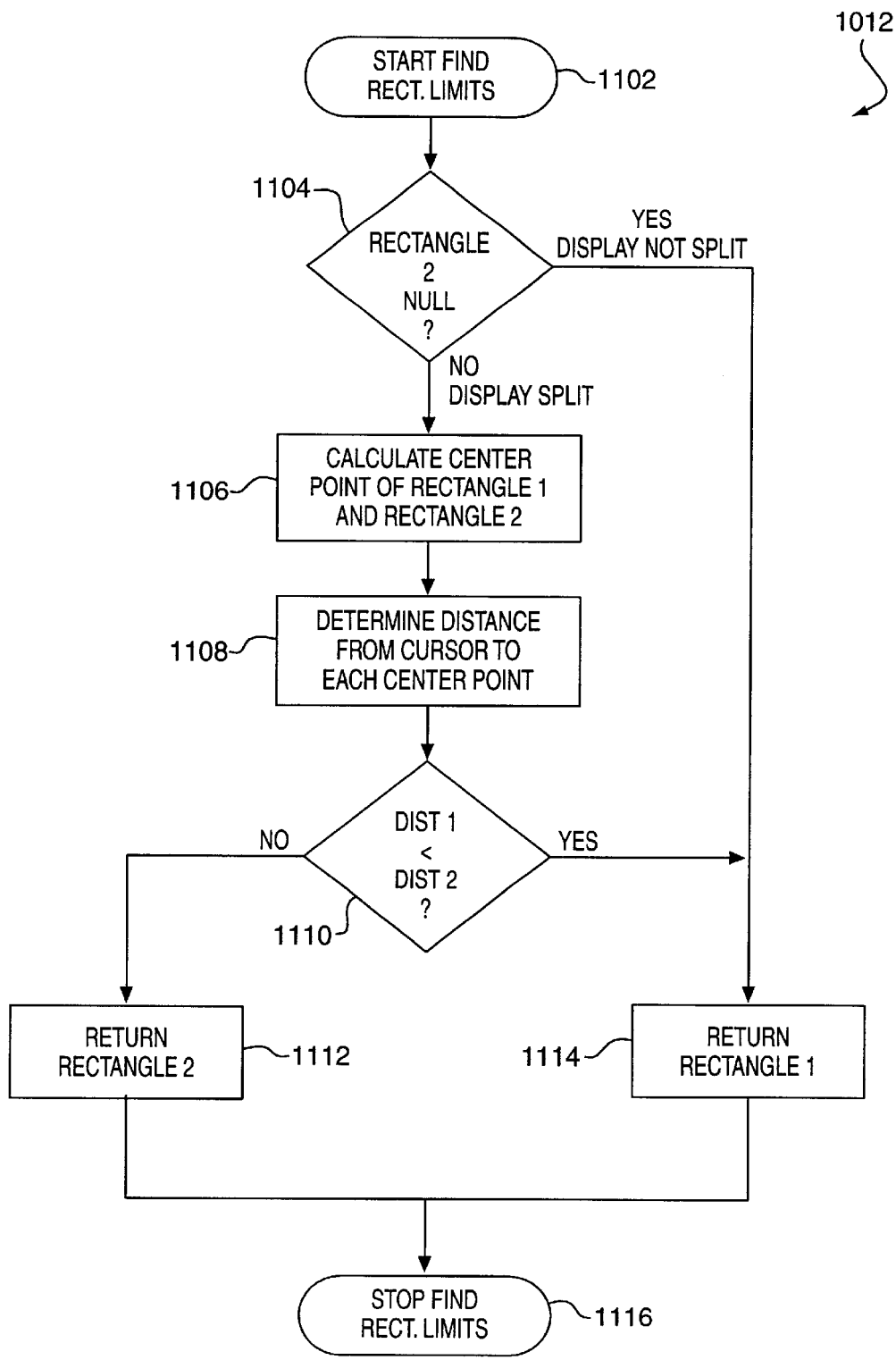
FIG. 11 is a flow chart of one embodiment of the process performed by the present invention to determine the display region in which the annotation label is to be positioned.
Figure 12:
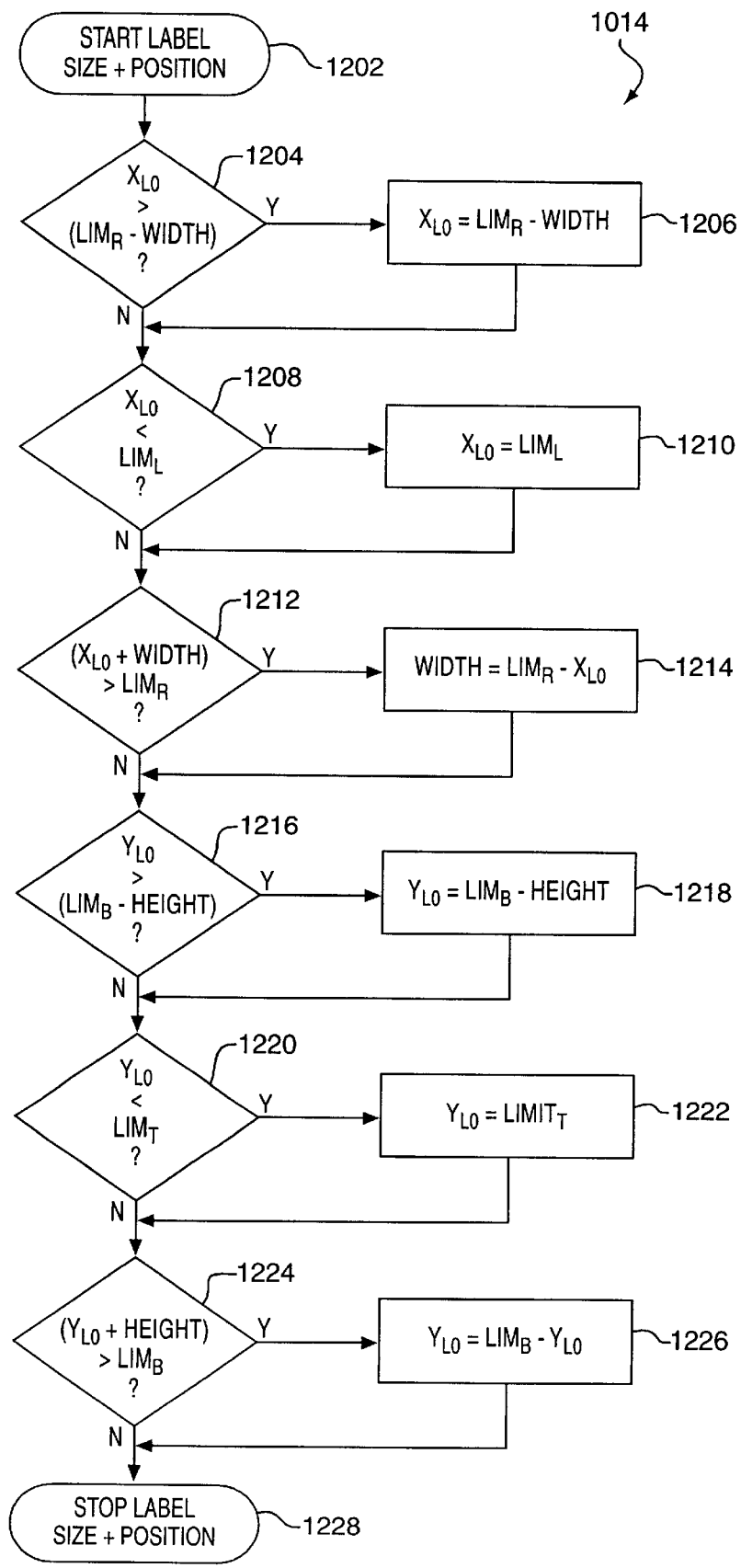
FIG. 12 is a flowchart of the processes performed by the present invention to determine the size and position of the associated annotation labels.
Figure 13:
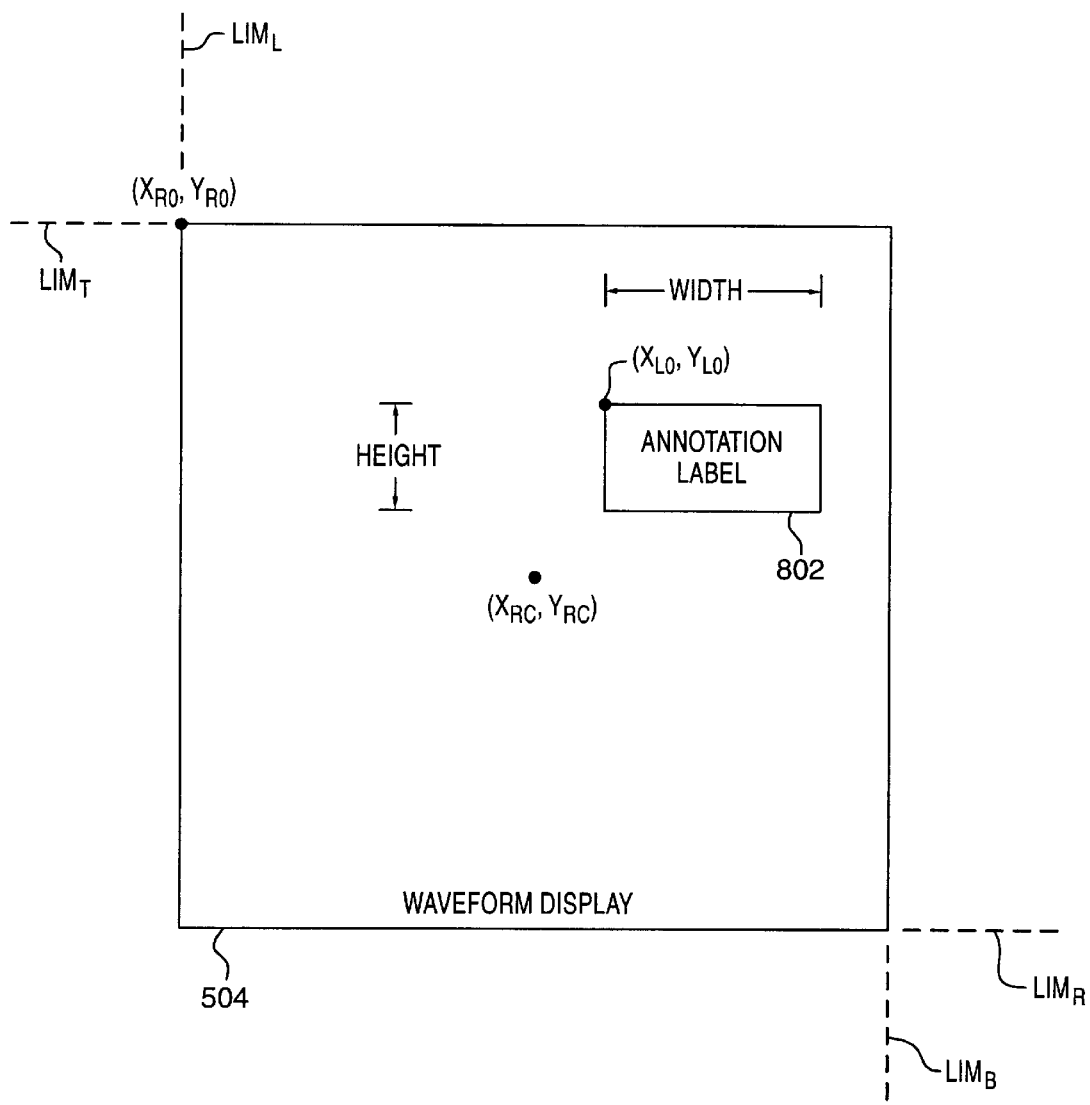
FIG. 13 is an illustration of an annotation label positioned within a display region showing the various characteristics utilized by embodiments of the present invention to determine the size and position of the associated annotation labels.

Certain aspects of the processing performed by annotation system 118 will be described below with reference to FIGS. 10–15. FIGS. 10–12 are flowcharts while FIG. 13 is an illustration of the terms used in describing the processes of FIGS. 10–12. Accordingly, FIG. 13 will be introduced first followed by a substantive discussion relative to the described processes.

Referring now to FIG. 13, a single waveform display 504 is defined by its boundaries on the display 112. The origin of waveform display 504 is the upper left corner, designated as $(x_{ro}, y_{ro})$, where "r" represents that this is a waveform display rectangle of pixels on which waveform display 504 is rendered as defined by graphical user interface 116. The "o" represents that this coordinate value is the origin of that rectangle.

There are four (4) limits which define the size and location of the rectangle of pixels on which waveform display 504 is rendered. They are the left and right limits or boundaries ($Lim_L$ and $Lim_R$) and the top and bottom limits or boundaries ($Lim_T$ and $Lim_B$). The center point in waveform display 504 is designated as $(x_{rc}, y_{rc})$.

One annotation label 802 is illustrated. Annotation label 802 has height and a width as shown, and an origin $(x_{lo}, y_{lo})$, where "l" represents that this is a label and "o" represents that this is a coordinate value for the origin of the label.

FIG. 10 is a flow chart of one embodiment of an update label size process performed in certain embodiments of the present invention. As noted, each label control unit 204 maintains the display of the associated annotation label 802, including the appearance of annotation label 802 as well as its contents. This includes updating the size of the annotation label 802 as necessary to continue to be located within waveform display region 504 and not interfere with the visualization of other annotation labels 802.

In the illustrative embodiment, an update label size process 1000 is performed in response to a command indicating that the font or text of a currently displayed annotation label has been changed by the operator. In addition, process 1000 is performed when an annotation label is first generated by a label control unit 204. For purposes of the present invention, such initial determination of the appearance and content of a new annotation label is modeled as a font and text change since these values are being processed for the first time when the annotation label is created.

At block 1004, a label control unit 204 receives a font. This occurs when label control unit 204 receives a rendering change command 272 from graphical user interface 116 that contains a font change. Label control unit 204 also retrieves the font stored locally when label control unit 204 receives a change in the content of the associated annotation label. In the illustrative embodiment, this content change occurs when label control unit 204 receives a new text data structure 268 from text entry dialog 278. If new font selection has been received, this information is stored locally for future calculations.

The width and the height of the received text is computed at block 1006. The height and width of the text is to be determined before the size of the annotation label can be calculated. Typically, the text presented in the annotation label is rendered in a proportional font. As such, to compute the width and the height of the block of text may be achieved utilizing various well known techniques. However, such operations are often provided by conventional operating systems. As noted, in one preferred embodiment, annotation system 118 is implemented in a computer based system running the Windows® operating system. In such an embodiment, label control unit 204 generates a system call to operating system 114 requesting such information. In such embodiments, the system call provided by the operating system 114 is the DT_Calc_Rect ("Draw Text-Calculate Rectangle") system call. When this system call is made with the appropriate parameters, operating system 114 returns the number of pixels in height and width that a given text will occupy when rendered in a given font without actually rendering the annotation label on graphical user interface 116.

Preferably, margins are provided around the text in the annotation label to facilitate visibility. The margins for the width are determined at block 1008 while the margins from the height are determined at block 1010. The value representing the text width is increased by a predetermined left margin and a predetermined right margin. Similarly, the value representing the text height is increased by a predetermined top margin and a predetermined bottom margin. These predetermined values may be any value to achieve a desired purpose.

Once the height and width required to render the text in an annotation label, label control unit 204 determines the size and position of the resulting annotation label. First, at block 1012, label control unit 204 determines the waveform display rectangle limits which are applicable to the current location of the annotation label. If there are two waveform displays currently displayed, such as regular and magnified waveform display regions, then label control unit 204 must determine in which the associated annotation label will be rendered. This is described further below with reference to FIG. 11.

After the appropriate waveform display region is determined and the associated rectangle limits are retrieved, label control unit 204 verifies that the size of the resulting annotation label is located fully within the waveform display and, if not either reposition or resize the annotation label accordingly. This is described in further detail below with reference to FIG. 12. Processing then ceases at block 1016.

FIG. 11 is a flow chart of one embodiment of the process performed by label control units 204 to determine which waveform display region an annotation label is to be positioned within. This process was introduced above at block 1012 of FIG. 10.

After the process is invoked at block 1102, label control unit 204 determines whether additional waveform displays are currently rendered on the graphical user interface. In the illustrative embodiment, there may be one additional waveform display for displaying a magnified view of selected waveforms displayed in the original waveform display. When such a feature is implemented in the system, the waveform display is the to be "split" between the two displays. As noted above, the graphical user interface 116 provides annotation label manager 202 with the rectangle limits of the waveform display via the rectangle limits command 226. Annotation label manager 202 forwards this information to the label control units 204 in the rectangle limits data structure 238. This information is stored locally and, at block 1104, scanned to determine whether it contains rectangle limits for one (main waveform display only is currently displayed) or two (main and magnified waveform displays are currently rendered).

If only the main waveform display is currently rendered, then the rectangle limits associated with that waveform display are returned to the process 1000 described above. If there are two waveform display regions currently rendered on the graphical user interface 1126, then a series of processes are performed to determined which waveform display region the operator desired to locate the annotation label.

At block 1106, label control units 204 calculate the center point of each rectangle. These values, $x_{rc}$ and $y_{rc}$, are determined using straight forward Euclidian geometry, with the origin of each waveform display rectangle at the upper left corder of the region as noted and shown in FIG. 13. Thus, $x_{rc}$ is determined by $$X_{rc}=Lim_L+(Lim_R-Lim_L)/2$$

Similarly, $y_{rc}$ is determined by $$Y_{rc}=Lim_T+(Lim_B-Lim_T)/2$$

This is repeated for both waveform display regions, yielding $(x_{rc1},y_{rc1})$ and $(x_{rc2},y_{rc2})$.

In accordance with one illustrative embodiment of the present invention, label control units 204 determine which waveform display region simply by determining which center point the cursor is closest to at the given moment. Thus, distance between the current cursor position and the center point of the main waveform display, $d_1$, is determined:

$$d_1=(x-x_{RC1})^2+(y-y_{RC1})^2,$$

while the distance between the current cursor position and the center point of the magnified waveform display region, $d_2$, is $$d_2=(x-x_{RC2})^2+(y-y_{RC2})^2.$$

If label control units 204 determined that d, is greater than $d_2$, then the annotation label is to be rendered in the main waveform display. The rectangle limits associated with the main waveform display are then utilized. Conversely, if label control units 204 determined that $d_1$ is not greater than $d_2$, then the annotation label is to be rendered in the magnified waveform display region and the associated rectangle limits are utilized at block 1112. Processing then ceases at block 1116.

FIG. 12 is a flowchart of the processes performed by label control units 204 to determine the size and position of annotation labels 802. This process was introduced above at block 1014 in FIG. 10.

After process 1014 is started at block 1202, a series of condition testing and associated setting of values are performed to determine the location of the annotation label and, if necessary, adjust its size.

At block 1204 label control unit 204 determines if the origin of the annotation label 802 is greater than the limit rect minus the width of the label, indicating that the annotation label 802 will extend beyond the right end of the waveform display boundary. If so, then the origin is adjusted leftward at block 1206 to a new horizontal location such that the width of the label fits within the waveform display right boundary.

At block 1208 label control unit 204 determines if the origin of the annotation label 802 is less than the left limit of the rectangle, indicating that the annotation label 802 will extend beyond the left boundary of the waveform display. If so, then the origin is adjusted rightward at block 1210 to a new horizontal location such that the width of label 802 fits within the waveform display left boundary.

However, if label 802 has a width that is greater than the width of the waveform display rectangle, then the width of the label is to be adjusted. This is determined at block 1212 whereat the label control unit 204 determines whether the sum of the label origin horizontal position plus the width of the label is greater than the right limit of the rectangle. If so, then at block 1214 the width of annotation label 802 is set to distance between the current horizontal position of the label origin and the right limit of the waveform display 504.

The above procedure is performed for the vertical positioning and resizing of annotation label 802 at blocks 1216–1226. Processing then ceases at block 1228.

Figure 14:
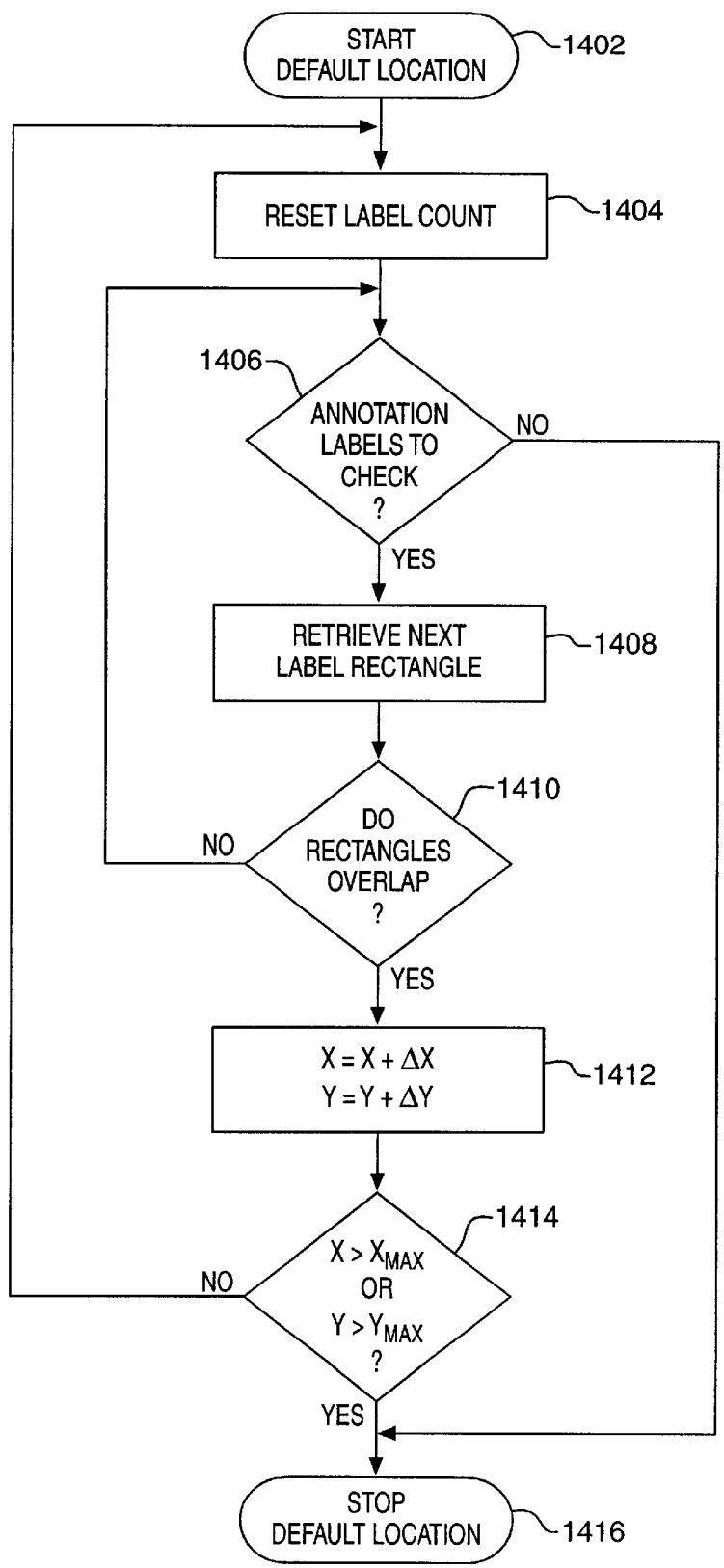
FIG. 14 is a flowchart of the processes performed by the present invention to determine a default location when a label is initially created and rendered on graphical user interface.

FIG. 14 is a flowchart of the processes performed by label control units 204 to determine a default location when a label is initially created and rendered on graphical user interface 116. Generally, when an annotation label 802 is created it is initially located at some default location on the waveform display region 504. As noted, the origin of the newly created label is initially located at the current cursor position or the waveform display origin, depending on the manner in which he annotation label was created. If multiple annotation labels are created in rapid succession without the operator moving the previously created annotation labels, the labels will be rendered ver each other, obscuring access to the underlying labels. To avoid this the process illustrated in FIG. 14 is performed by label control units 204. It should be understood that there are numerous approaches to insure that at least a portion of an underlying annotation label is visible and accessible by the operator, at least to the extent necessary to enable the operator to position the cursor of the exposed area a drag the annotation label to a desired location on the waveform display.

In the illustrative process illustrated in FIG. 14, the label count is reset at block 1404 after the process is initialized at start block 1402. Here, the label count is as noted above; a unique value is sequentially assigned to annotation labels as they are created.

At blocks 1406 and 1408 the next sequential annotation label is retrieved for comparison unit no further currently visible labels remain. Overlap of the annotation labels is determined at block 1410 based on the origin, width and height of the labels. If there is overlay then the origin of the new label is adjusted by some fixed amount to cause the labels to appear in some preferred manner, such as in a cascade form.

This process is repeated for all new labels that are successively crated, or unit the waveform region boundary is reached, as determine by block 1414. Once either of these conditions occur, processing ceases at block 1416.

Figure 15:
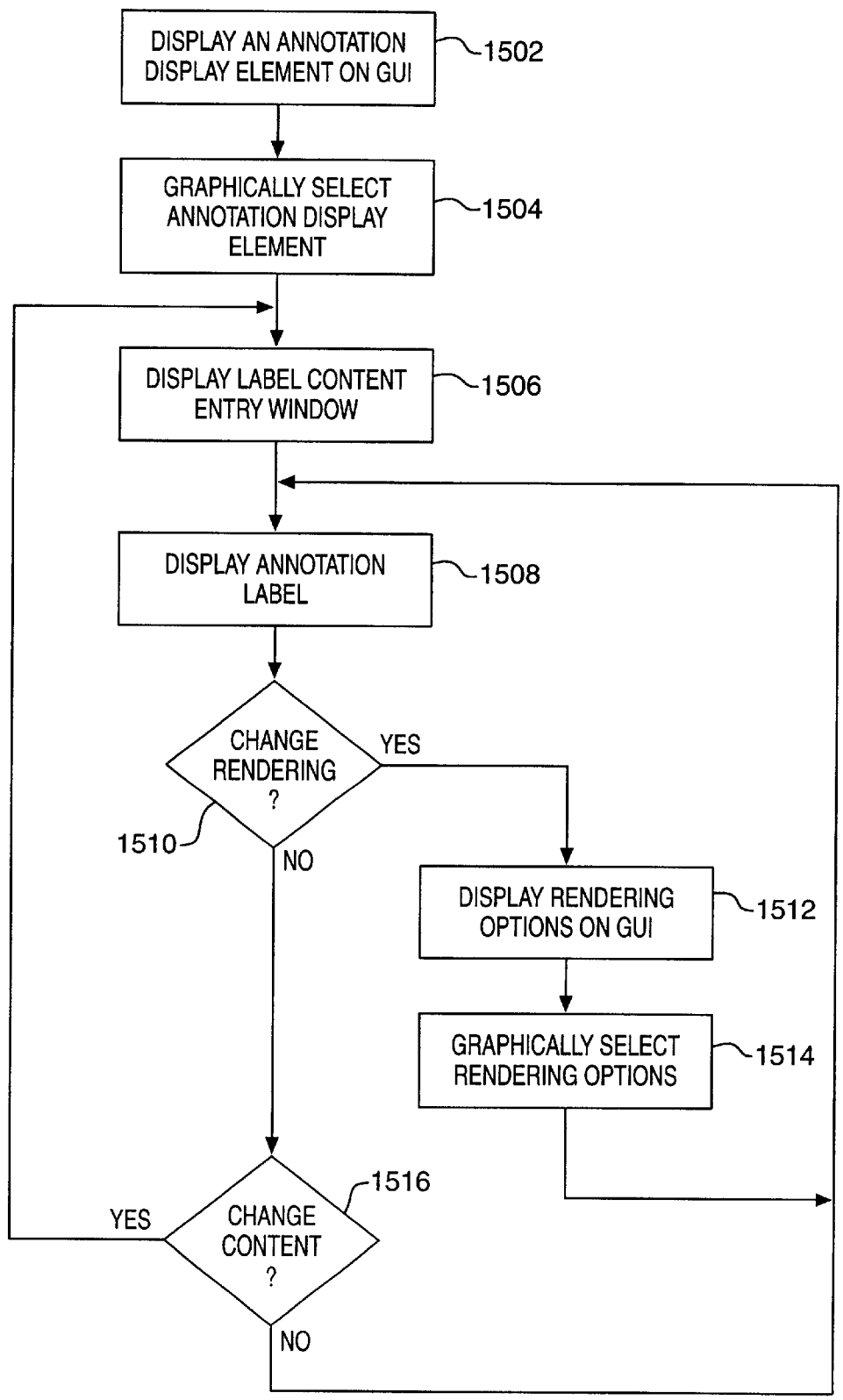
FIG. 15 is a flow chart of the operations performed to graphically add and modify an annotation label in accordance with one embodiment of the present invention.

FIG. 15 is a flow chart of the operations performed to graphically add and modify an annotation label in accordance with one embodiment of the present invention. At block 1502 a display element representing adding an annotation label to the graphical user interface is displayed on graphical user interface 116. As noted, the annotation display element may be any known display element supported by graphical user interface 116 and operating system 114. For example, the display element may be an icon, graphical button rendered on a dialog box, an item on a menu list, an entry on a toolbar, and the like.

The operator graphically selects the annotation display element at block 1504. Preferably, some type of pointing device is provided in the implementing system to enable the operator to control the position of the cursor on graphical user interface 116. The graphical selection is preferably achieved by controlling the cursor on graphical user interface 116 using such a pointing device and, once positioned over the annotation display element, selects the display element.

At block 1506 a window or dialog box is displayed on graphical user interface 116 providing the operator with the ability to enter a desired content to be displayed in the annotation label. In one embodiment described above, a dialog box is displayed with a graphical keyboard for entry of desired text using a pointing device. Alternatively or in addition, a physical keyboard operatively attached to the implementing system may also be used. In either embodiment, the text is displayed on the graphical user interface. In alternative embodiments, additional information is selected as well, including graphical symbols, reference lines and arrows, and the like. At block 1506 the operator also enters in the desired text or other information into the appropriate content entry fields.

An annotation label is displayed on graphical user interface 116 at block 1508. This operation may be performed before or after the operations described above with respect to block 1506. If before, then either no contents or default contents may be initially displayed.

In certain embodiments, the operator is provided with the opportunity to alter the manner in which the annotation label is rendered. In such an embodiment, a display element is displayed on the graphical user interface indicating such an option exists. This display element, like the others, may take on any known format. Selection of the display element causes the operations shown at block 1512 to be performed. Here, a rendering options display window is displayed on the graphical user interface. The operator may make any available selection at block 1514, after which the revised annotation label is displayed align at block 1508.

A display element providing the operator with an opportunity to modify the contents of the annotation label is provided in certain embodiments of the present invention. This option is invoked through the display and subsequent selection of a properly identified display element on the graphical user interface. Such a selection will cause the operations described above with respect to block 1506 to be repeated. This process may continue indefinitely as shown by the return to block 1508.

While various embodiments of the present invention have been described above, it should be understood that they have been presented by way of example only, and not limitation. For example, the present invention is preferable implemented in the system 100. However, as one skilled in the relevant art would find apparent, the teachings of the present invention may be implemented to enable a user to annotate any display element other than waveforms in systems other than a system. It should also be noted that any techniques now or later developed may be used to implement the features of the present invention, such as local or distributed databases for storage of the data structures; the type and format of the data structures, such as linked lists, tables, etc., the manner in which the IDs, status fields and measurement parameters are represented, the manner in which the present invention interfaces with the graphical user interface; the manner in which the information is displayed to the user, etc. Thus, the breadth and the scope of the present invention are not limited by any of the above exemplary embodiments, but are defined only in accordance with the following claims and their equivalents.

What is claimed is:

1. A software product for annotating a waveform display, the product comprising
    annotation software configured to direct a processor to enable an operator to generate and position an annotation label at a desired location on the waveform display and associate the annotation label with a waveform on the waveform display, and to direct the processor to control annotation color to assume associated waveform color and automatically move another annotation label that is already positioned at the desired location; and
    computer-readable storage medium configured to store the annotation software.

2. The product of claim 1 wherein the annotation software is configured to direct the processor to automatically cascade the annotation label with the other annotation label that is already positioned at the desired location.

3. The product of claim 1 wherein the annotation software is configured to direct the processor to restrict the desired location to within the waveform display.

4. The product of claim 1 wherein the annotation color comprises text color.

5. The product of claim 1 wherein the annotation color comprises background color.

6. The product of claim 1 wherein the annotation software is configured to direct the processor to enable the generation and positioning of the annotation label in response to a right click from a pointing device.

7. The product of claim 1 wherein the annotation software is configured to direct the processor to enable the generation and positioning of the annotation label in response to an operator voice input.

8. An annotation system for annotating a waveform display, the system comprising:
    a graphical user interface configured to display an annotation label and a waveform on the waveform display; and
    a computer system configured to control the graphical user interface to enable an operator to generate and position the annotation label at a desired location on the waveform display and associate the annotation label with the waveform, and to control the graphical user interface to control annotation color to assume associated waveform color and automatically move another annotation label that is already positioned at the desired location.

9. The annotation system of claim 8 wherein the computer system is configured to control the graphical user interface to automatically cascade the annotation label with the other annotation label that is already positioned at the desired location.

10. The annotation system of claim 8 wherein the computer system is configured to control the graphical user interface to restrict the desired location to within the waveform display.

11. The annotation system of claim 8 wherein the annotation color comprises text color.

12. The annotation system of claim 8 wherein the annotation color comprises background color.

13. The annotation system of claim 8 wherein the computer system is configured to control the graphical user interface to enable the generation and positioning of the annotation label in response to a right click from a pointing device.

14. The annotation system of claim 8 wherein the computer system is configured to control the graphical user interface to enable the generation and positioning of the annotation label in response to an operator voice input.

15. A method of operating a computer system to annotate a waveform display, the method comprising:

displaying a waveform on the waveform display;

enabling a computer operator to generate and position an annotation label at a desired location on the waveform display;

enabling the computer operator to associate the annotation label with the waveform;

controlling annotation color to assume associated waveform color; and automatically moving another annotation label that is already positioned at the desired location.

16. The method of claim 15 wherein automatically moving the other annotation label further comprises automatically cascading the annotation label with the other annotation label.

17. The method of claim 15 further comprising restricting the desired location to within the waveform display.

18. The method of claim 15 wherein the annotation color comprises text color.

19. The method of claim 15 wherein the annotation color comprises background color.

20. The method of claim 15 wherein enabling the computer operator to generate and position the annotation label comprises enabling the computer operator to generate and position the annotation label in response to a right click from a pointing device.

21. The method of claim 15 wherein enabling the computer operator to generate and position the annotation label comprises enabling the computer operator to generate and position the annotation label in response to an operator voice input.

* * * * *